United States Patent
Sasaki et al.

(10) Patent No.: US 7,550,665 B2
(45) Date of Patent: Jun. 23, 2009

(54) STACKED PHOTOELECTRIC CONVERTER

(75) Inventors: Toshiaki Sasaki, Otsu (JP); Yohei Koi, Otsu (JP); Kenji Yamamoto, Kobe (JP); Masashi Yoshimi, Kobe (JP); Mitsuru Ichikawa, Otsu (JP)

(73) Assignee: Kaneka Corporation, Osaka (JP)

( * ) Notice: Subject to any disclaimer, the term of this patent is extended or adjusted under 35 U.S.C. 154(b) by 696 days.

(21) Appl. No.: 10/530,283

(22) PCT Filed: Jul. 15, 2004

(86) PCT No.: PCT/JP2004/010115

§ 371 (c)(1),
(2), (4) Date: Apr. 4, 2005

(87) PCT Pub. No.: WO2005/011001

PCT Pub. Date: Feb. 3, 2005

(65) Prior Publication Data

US 2006/0043517 A1 Mar. 2, 2006

(30) Foreign Application Priority Data

Jul. 24, 2003 (JP) ............................. 2003-279493
Oct. 28, 2003 (JP) ............................. 2003-367535
Oct. 28, 2003 (JP) ............................. 2003-367536
Mar. 26, 2004 (JP) ............................. 2004-091897

(51) Int. Cl.
*H01L 31/00* (2006.01)
*H02N 6/00* (2006.01)

(52) U.S. Cl. ...................... 136/246; 136/261; 136/258

(58) Field of Classification Search ...................... None
See application file for complete search history.

(56) References Cited

U.S. PATENT DOCUMENTS 4,377,723 A 3/1983 Dalal (Continued)

FOREIGN PATENT DOCUMENTS

EP 1198014 A2 * 4/2002

(Continued)

OTHER PUBLICATIONS machine translation of JP 2002-170973, Jun. 2002, JPO Website.*

(Continued)

*Primary Examiner*—Alexa D Neckel
*Assistant Examiner*—Miriam Berdichevsky
(74) *Attorney, Agent, or Firm*—Hogan & Hartson LLP

(57) ABSTRACT

In a stacked-layer type photoelectric conversion device, a plurality of photoelectric conversion units are stacked on a substrate, each of which includes a one conductivity-type layer, a photoelectric conversion layer of substantially intrinsic semiconductor and an opposite conductivity-type layer in this order from a light-incident side. At least one of the opposite conductivity-type layer in a front photoelectric conversion unit arranged relatively closer to the light-incident side and the one conductivity-type layer in a back photoelectric conversion unit arranged adjacent to the front photoelectric conversion unit includes a silicon composite layer at least in a part thereof. The silicon composite layer has a thickness of more than 20 nm and less than 130 nm and an oxygen concentration of more than 25 atomic % and less than 60 atomic %, and includes silicon-rich phase parts in an amorphous alloy phase of silicon and oxygen.

15 Claims, 23 Drawing Sheets

U.S. PATENT DOCUMENTS

| | | | |
|---|---|---|---|
| 4,398,054 A | 8/1983 | Madan | 136/255 |
| 4,776,894 A | 10/1988 | Watanabe et al. | |
| 4,875,944 A * | 10/1989 | Yoshida | 136/249 |
| 4,926,230 A * | 5/1990 | Yamagishi et al. | 136/249 |
| 5,403,404 A | 4/1995 | Arya et al. | |
| 6,384,319 B1 | 5/2002 | Sasaki et al. | |
| 6,777,706 B1 | 8/2004 | Tessler et al. | |
| 2002/0066478 A1 | 6/2002 | Hayashi et al. | |

FOREIGN PATENT DOCUMENTS

| | | | |
|---|---|---|---|
| JP | 59-000972 | | 1/1984 |
| JP | 59035016 A | * | 2/1984 |
| JP | 62-158368 | | 7/1987 |
| JP | 63-120476 | | 5/1988 |
| JP | 05-095126 | | 4/1993 |
| JP | 05-152592 | | 6/1993 |
| JP | 06-267868 | | 9/1994 |
| JP | 07-015025 | | 1/1995 |
| JP | 11-186574 | | 7/1999 |
| JP | 11-243219 | | 9/1999 |
| JP | 2000-138384 | | 5/2000 |
| JP | 2000-269528 | | 9/2000 |
| JP | 2002-076396 | | 3/2002 |
| JP | 2002-170973 | | 6/2002 |
| JP | 2002170973 A | * | 6/2002 |
| JP | 2002520683 A | | 7/2002 |
| JP | 2002-237608 | | 8/2002 |
| JP | 2002-261305 | | 9/2002 |
| JP | 2002-261308 | | 9/2002 |
| JP | 2003-124481 | | 4/2003 |
| JP | 2003-142709 | | 5/2003 |
| JP | 2003-258279 | | 9/2003 |
| JP | 2003-258297 | | 9/2003 |
| WO | 0004593 | | 1/2000 |

OTHER PUBLICATIONS

Japanese language office action and its English translation for corresponding Japanese application No. 2003-367536 lists of references above.

* cited by examiner

STACKED PHOTOELECTRIC CONVERTER

TECHNICAL FIELD

The present invention relates to improvement of conversion efficiency of a thin-film photoelectric conversion device, and more particularly to improvement of conversion efficiency of a stacked-layer type thin-film photoelectric conversion device having a plurality of photoelectric conversion units stacked one another. Herein, the terms "crystalline" and "microcrystalline" are used also for denoting a solid state partially including amorphous parts, as generally used in the art.

BACKGROUND ART

In recent years, to simultaneously achieve lower costs and higher efficiency of a photoelectric conversion device, thin-film photoelectric conversion devices having almost no problem from the standpoint of resources have attracted attention, and development thereof has been tried vigorously. Application of the thin-film photoelectric conversion devices to various uses such as solar batteries, optical sensors, displays and others have been expected. An amorphous silicon photoelectric conversion device as one type of the thin-film photoelectric conversion devices can be formed on a low-temperature, large-area substrate such as glass substrate or stainless steel substrate, with which cost reduction is expected.

A thin-film photoelectric conversion device generally includes a first electrode, one or more semiconductor thin-film photoelectric conversion units, and a second electrode, which are successively stacked on a substrate having an insulative surface. Each thin-film photoelectric conversion unit includes an i-type layer sandwiched between a p-type layer and an n-type layer.

The i-type layer, which is a substantially intrinsic semiconductor layer, occupies the most part of thickness of the thin-film photoelectric conversion unit. Photoelectric conversion occurs primarily in this i-type layer. Thus, a thicker i-type photoelectric conversion layer is preferable from the standpoint of light absorption, though an unnecessarily thick layer leads to increase of both costs and time for deposition thereof.

On the other hand, the p-type and n-type conductive layers serve to generate diffusion potential in the photoelectric conversion unit. The magnitude of the diffusion potential influences the value of open-circuit voltage that is one of the critical characteristics of the thin-film photoelectric conversion device. These conductive layers, however, are inactive layers not contributing to photoelectric conversion. Light absorbed by the impurities introduced into the conductive layers becomes loss without contributing to generation of electric power. As such, it is preferable that the p-type and n-type conductive layers are as thin as possible within a range ensuring generation of sufficient diffusion potential.

A photoelectric conversion unit or a thin-film solar battery is called an amorphous photoelectric conversion unit or an amorphous thin-film solar battery in the case that it includes an amorphous i-type photoelectric conversion layer occupying its main part whether its p-type and n-type conductive layers are amorphous or crystalline, and is called a crystalline photoelectric conversion unit or a crystalline thin-film solar battery in the case that it includes a crystalline i-type layer.

In general, in a semiconductor used for the photoelectric conversion layer, the light absorption coefficient decreases as the light wavelength increases. In particular, when the photoelectric conversion material is in a state of a thin film, sufficient light absorption is not expected in the wavelength region of small absorption coefficient, and thus the photoelectric conversion amount is restricted depending on the thickness of the photoelectric conversion layer. Therefore, measures have been taken to generate a large amount of photocurrent, by forming a light scattering structure for preventing light having come into the photoelectric conversion device from easily escaping to the outside, to thereby increase the substantial optical path length and cause sufficient absorption. For example, when the light is incident on a transparent substrate side, a textured transparent conductive film having fine unevenness is used as a light incident side electrode.

Further, as a way of improving the conversion efficiency of the thin-film photoelectric conversion device, it is known to form a stacked-layer type thin-film photoelectric conversion device having at least two photoelectric conversion units stacked one another. In such a way, a front photoelectric conversion unit including a photoelectric conversion layer having a large band gap is arranged on a light incident side of the photoelectric conversion device, and back photoelectric conversion units each including a photoelectric conversion layer (of, e.g., Si—Ge alloy) having a smaller band gap in turn are successively arranged on the back of the front unit so as to enable photoelectric conversion over a wide wavelength range of the incident light, to thereby improve the conversion efficiency of the entire device. Of the stacked-layer type photoelectric conversion devices, one including both the amorphous and crystalline photoelectric conversion units is called a hybrid type photoelectric conversion device. In the hybrid type photoelectric conversion device, the wavelength of light photoelectrically convertible with the amorphous silicon is about 800 nm on the longer wavelength side, whereas the light of longer wavelength of up to about 1100 nm can be photoelectrically converted by the crystalline silicon, so that effective photoelectric conversion becomes possible over a wider wavelength range of the incident light.

In the stacked-layer type photoelectric conversion device, the photoelectric conversion units are connected in series. The shorted-circuit current density (Jsc) of the photoelectric conversion device is restricted by the smallest one of current values generated by the photoelectric conversion units therein. Thus, it is preferable that the current values of the photoelectric conversion units are as even as possible. Further, improvement of conversion efficiency is expected with the greater absolute value of the current. In the stacked-layer type photoelectric conversion device, a conductive intermediate reflective layer having both light transmitting and reflecting properties may be interposed between the photoelectric conversion units. In this case, light having reached the intermediate reflective layer is partially reflected, and thus it is possible to increase the light absorption amount and then increase the current generated within the front photoelectric conversion unit located closer to the light incident side than the intermediate reflective layer. This means that the effective thickness of the front photoelectric conversion unit is apparently increased.

For example, in the case that an intermediate reflective layer is inserted in a hybrid type photoelectric conversion device formed of a front amorphous silicon photoelectric conversion unit and a back crystalline silicon photoelectric conversion unit, the current generated in the front photoelectric conversion unit can be increased without increasing the thickness of the amorphous silicon photoelectric conversion layer. Further, when the intermediate reflective layer is included, the thickness of the amorphous silicon photoelectric conversion layer required to obtain the same current value can be decreased as compared to the case not including the intermediate layer. As such, it is possible to restrict deterioration in properties of the amorphous silicon photoelectric conversion unit due to the optical deterioration (Sraebler-Wronsky effect) that becomes considerable in accordance with increase of thickness of the amorphous silicon layer.

A conventional intermediate reflective layer is often formed of TCO (transparent conductive oxide) such as polycrystalline ITO (indium tin oxide) or ZnO, particularly of ZnO. The ZnO intermediate reflective layer, however, is formed by sputtering or spraying, which requires a film deposition apparatus besides the plasma CVD (chemical vapor deposition) apparatus generally used for formation of semiconductor films. This increases the equipment costs and the production tact time. Further, when sputtering is employed for formation of the ZnO layer, there is a possibility that the underlying semiconductor film suffers degradation in its properties due to damages caused by sputtering.

Moreover, it is necessary to form a good ohmic contact at the interface between the TCO intermediate reflective layer and the semiconductor layer so as to suppress an adverse effect on the series resistance of the stacked-layer type photoelectric conversion device. However, it is generally known that it is not easy to form an ohmic contact at an interface between a ZnO layer and an amorphous silicon layer or a crystalline silicon layer. More specifically, if the dark conductivity of the ZnO intermediate reflective layer is lower than $1.0 \times 10^2$ S/cm, the intermediate reflective layer cannot form a good ohmic contact with the front photoelectric conversion unit or with the back photoelectric conversion unit, leading to increase of the contact resistance, which will in turn decrease the fill factor (FF) of the stacked-layer type photoelectric conversion device. On the contrary, if the dark conductivity of the ZnO layer is greater than $1.0 \times 10^3$ S/cm, the light transmittance will decrease, and then the shorted-circuit current density (Jsc) of the stacked-layer type photoelectric conversion device will decrease. As such, it is necessary to set the dark conductivity of the TCO layer at a relatively high level in a range from $1.0 \times 10^2$ S/cm to $1.0 \times 10^3$ S/cm by impurity doping or by adjusting the degree of oxidation.

A large-area thin-film photoelectric conversion device is generally formed as an integrated type thin-film photoelectric conversion module. The integrated type thin-film photoelectric conversion module has a structure in which a plurality of photoelectric conversion cells are separated from each other to have their respective small areas and are electrically connected in series on a glass substrate. Normally, each photoelectric conversion cell is formed by successively depositing and patterning, on the glass substrate, a transparent electrode layer, one or more thin-film semiconductor photoelectric conversion unit layers, and a back electrode layer.

FIG. 30 is a schematic cross sectional view of an example of a conventional integrated type thin-film photoelectric conversion module having a plurality of stacked-layer photoelectric conversion cells connected in series, provided with no intermediate reflective layer. Incidentally, throughout the drawings, the same reference characters denote the same or corresponding portions. A photoelectric conversion module 101 has a structure in which a transparent electrode layer 103, a front amorphous silicon photoelectric conversion unit layer 104a, a back crystalline silicon photoelectric conversion unit layer 104b, and a back electrode layer 106 successively stacked on a glass substrate 102.

Integrated type thin-film photoelectric conversion module 101 is provided with first and second isolation grooves 121, 122 for electrically isolating photoelectric conversion cells 110 from each other, and a connection groove 123 for electrically connecting the cells in series. First and second isolation grooves 121, 122 and connection groove 123 are parallel to each other, and extend in the direction perpendicular to the paper plane of FIG. 30. That is, first isolation groove 121 separates transparent electrode layer 103 into a plurality of regions, corresponding to the respective photoelectric conversion cells 110. Similarly, second isolation groove 122 separates front photoelectric conversion unit layer 104a, back photoelectric conversion unit layer 104b, and back electrode layer 106 into a plurality of regions, corresponding to the respective photoelectric conversion cells 110.

Connection groove 123 provided between first isolation groove 121 and second isolation groove 122 penetrates through front and back photoelectric conversion unit layers 104a and 104b. Connection groove 123 is filled with the same metal material as that of back electrode layer 106, and electrically connects in series back electrode 106 of one photoelectric conversion cell 110 to transparent electrode 103 of the neighboring photoelectric conversion cell 110.

An integrated type thin-film photoelectric conversion module of FIG. 31 differs from the module of FIG. 30 only in that a TCO intermediate reflective layer 105 is inserted between front and back photoelectric conversion unit layers 104a and 104b. In the photoelectric conversion module of FIG. 31, connection groove 123 penetrates through front photoelectric conversion unit layer 104a, TCO intermediate reflective layer 105, and back photoelectric conversion unit layer 104b, and is filled with the same metal material as that of back electrode layer 106. That is, the metal material filled in connection groove 123 comes into contact with TCO intermediate reflective layer 105.

TCO intermediate reflective layer 105 has high dark conductivity in the range of $1.0 \times 10^2$ S/cm to $1.0 \times 10^3$ S/cm as described above, and thus electric current can easily flow through TCO layer 105 in a direction parallel to substrate 102. Therefore, back photoelectric conversion unit 104b is short-circuited due to the current path through TCO intermediate reflective layer 105, connection groove 123 and back electrode layer 106, causing a large leakage current. As a result, in the photoelectric conversion module of FIG. 31, the electric power generated at back photoelectric conversion unit 104b can hardly be taken out.

PRIOR ART EXAMPLE 1

The above-described problem of leakage current can be solved by employing a structure shown in FIG. 32 (see a first patent document: Japanese Patent Laying-Open No. 2002-261308). More specifically, in the integrated type thin-film photoelectric conversion module 101 of FIG. 32, in addition to first and second isolation grooves 121 and 122, a third isolation groove 124 is provided between first isolation groove 121 and connection groove 123. Third isolation groove 124 penetrates through front photoelectric conversion unit 104a and intermediate reflective layer 105. Although third isolation groove 124 may be arranged such that first isolation groove 121 is located between third isolation groove 124 and connection groove 123, provision of the third isolation groove between first isolation groove 121 and connection groove 123 as shown in FIG. 32 is more advantageous in that the area effective for power generation can readily be increased.

In the photoelectric conversion module 101 of FIG. 32, provision of third isolation groove 124 can prevent the current generated by front photoelectric conversion unit 104a from leaking through TCO intermediate reflective layer 105 and connection groove 123. However, photoelectric conversion module of FIG. 32 includes third isolation groove 124 additionally as compared to the module of FIG. 30. The first through third isolation grooves and the connection groove are usually formed by patterning with YAG laser or the like. The number of patterning steps increases by one for photoelectric conversion module of FIG. 32 compared to that of the module of FIG. 31, leading to increase of the manufacturing costs and time.

Further, in forming the photoelectric conversion module of FIG. 30, it is possible to successively form front and back photoelectric conversion units 104a and 104b in a plasma CVD apparatus. By comparison, in forming the photoelectric conversion module of FIG. 32, it is necessary to form front photoelectric conversion unit 104a by plasma CVD and form TCO intermediate reflective layer 105 by sputtering, and then, the substrate should be temporarily taken out of the vacuum chamber in order to carry out patterning with YAG laser. Thereafter, with the substrate returned into the vacuum chamber, it is necessary to form back photoelectric conversion unit 104b by plasma CVD. As such, the manufacturing time and costs both increase in the case of the photoelectric conversion module of FIG. 32, as compared to the module of FIG. 30.

Still further, since the substrate is taken out to the ambient air after formation of TCO intermediate reflective layer 105, impurities in the ambient air may be adsorbed into the interface between intermediate reflective layer 105 and back photoelectric conversion unit 104b, possibly leading to degradation in properties of the photoelectric conversion module, occurrence of peeling of the thin films, and then degradation of reliability.

Furthermore, since provision of third isolation groove 124 increases loss of the effective area of the thin-film photoelectric conversion cell, the effect of improving the properties of the photoelectric conversion module by provision of TCO intermediate reflective layer 105 may not fully be achieved.

PRIOR ART EXAMPLE 2

A second patent document of Japanese Patent Laying-Open No. 5-95126 discloses an example of using amorphous silicon oxide as a material of one conductivity-type layer in a stacked-layer type photoelectric conversion device. In this stacked-layer type photoelectric conversion device, a transparent electrode of $SnO_2$ or the like, a first p-type layer of amorphous silicon carbide, a first i-type layer of amorphous silicon, a first n-type layer of amorphous silicon oxide, a second p-type layer of amorphous silicon carbide, a second i-type layer of amorphous silicon, a second n-type layer of amorphous silicon, and a metal electrode of Ag or the like, are stacked successively on a glass substrate. Although it is common to use amorphous silicon or microcrystalline silicon for the first n-type layer, it is reported in the second patent document that the use of amorphous silicon oxide having a large band gap can reduce the light absorption loss. As a result, it becomes possible to increase the amount of the light transmitting the first n-type layer within the front photoelectric conversion unit and reaching the second i-type layer within the back photoelectric conversion unit, leading to improvement in the shorted-circuit current density (Jsc) of the stacked-layer type photoelectric conversion device.

The oxygen concentration of the amorphous silicon oxide layer can be adjusted as desired. As the oxygen concentration increases, the energy band gap becomes wider, leading to increase of the transmittance. In the amorphous silicon oxide layer, on the other hand, conductivity decreases as the oxygen concentration increases. It is reported in the second patent document that the first n-type layer of amorphous silicon oxide needs to have conductivity of greater than $1 \times 10^{-6}$ S/cm when irradiated with light. To this end, when the amorphous silicon oxide is represented by a general expression of "a-$Si_{1-x}O_x$", the value of x should be less than 0.2.

The second patent document describes that the current generated in the back photoelectric conversion unit increases because of the increase of the light reaching the second i-type layer, and then Jsc of the stacked-layer type thin-film photoelectric conversion device increases, leading to improvement of the conversion efficiency. The second patent document, however, is silent about improvement of the current generated in the front photoelectric conversion unit. In the second patent document, the oxygen concentration of the amorphous silicon oxide film is restricted to less than 20%. Thus, it can be said that the refractive index of the amorphous silicon oxide film regarding the light of 600 nm wavelength is at least about 3, as shown in FIG. 5. In such a case, difference in refractive index between the amorphous silicon oxide layer and the amorphous silicon layer is small, and therefore, increase of current in the front photoelectric conversion unit by the effect of reflection at the interface cannot be expected. To make the amorphous silicon oxide layer function as the intermediate reflective layer, it is necessary to increase its oxygen concentration so as to decrease the refractive index. In this case, however, the illuminated conductivity of the amorphous silicon oxide layer decreases, leading to decrease of FF of the stacked-layer type photoelectric conversion device and then decrease in the conversion efficiency. This is why the amorphous silicon oxide layer is not used as the intermediate reflective layer in the second patent document.

First patent document: Japanese Patent Laying-Open No. 2002-261308

Second patent document: Japanese Patent Laying-Open No. 5-95126

DISCLOSURE OF THE INVENTION

Problems to be Solved by the Invention

As described above, when a TCO layer of ZnO or the like is used as the intermediate reflective layer in the stacked-layer type photoelectric conversion device, the method of forming the TCO layer differs from that for semiconductor layers, and thus an apparatus or a film deposition chamber for forming the TCO layer should be additionally provided, which inevitably increases the apparatus costs. Specifically, the semiconductor layers are formed by plasma CVD, while sputtering or spraying is used for forming the TCO intermediate reflective layer.

Further, in the case that the integrated type thin-film photoelectric conversion module is formed including the TCO layer as the intermediate reflective layer, the leakage current possibly occurs in the structure having the first and second isolation grooves and the connection groove, leading to degradation in properties of the photoelectric conversion module.

Although the problem of the leakage current may be solved by providing the third isolation groove 124 as shown in FIG. 32, this requires an additional patterning step, leading to increase of the production costs and time. Further, the interface between the intermediate reflective layer and the back photoelectric conversion unit may be contaminated by exposure to the ambient air. Still further, provision of the third isolation groove increases loss of the effective area of the effective photoelectric conversion region.

In view of the foregoing problems in the prior art, an object of the present invention is to provide a stacked-layer type thin-film photoelectric conversion device and an integrated type thin-film photoelectric conversion module improved in photoelectric conversion efficiency without substantially increasing costs and time required for fabrication thereof.

Means to Solve the Problems

In a stacked-layer type photoelectric conversion device according to the present invention, a plurality of photoelectric conversion units are stacked on a substrate, each of which includes a one conductivity-type layer, a photoelectric conversion layer of substantially intrinsic semiconductor, and an opposite conductivity-type layer in this order from a light incident side. At least one of the opposite conductivity-type layer in a front photoelectric conversion unit arranged relatively closer to the light incident side and the one conductivity-type layer in a back photoelectric conversion unit arranged adjacent to that front photoelectric conversion unit includes a silicon composite layer at least in a part thereof. The silicon composite layer has a thickness of more than 20 nm and less than 130 nm and an oxygen concentration of more than 25 atomic % and less than 60 atomic %, and includes silicon-rich phase parts in an amorphous alloy phase of silicon and oxygen. Herein, the term "silicon-rich" literally means that the silicon concentration is high. Thus, the silicon-rich phase part refers to a phase part having a high silicon concentration.

It is more preferable that the silicon composite layer has the oxygen concentration of more than 40 atomic % and less than 55 atomic % to achieve low refractive index. When the silicon composite layer has the thickness of more than 20 nm and less than 130 nm, it can bring about an effective reflection effect. It is more preferable that the silicon composite layer has the thickness of more than 50 nm and less than 100 nm to obtain an optimal reflection effect.

That is, when the oxygen concentration of the silicon composite layer is increased to achieve low refractive index, the reflection effect at the interface with the neighboring semiconductor layer is improved. The silicon composite layer can achieve high dark conductivity, despite the high oxygen concentration, because it includes the silicon-rich phase parts. As such, use of the silicon composite layer can ensure both the high reflection effect and the high dark conductivity. Accordingly, the current generated in the front photoelectric conversion unit can be increased, resulting in improvement in the performance of the stacked-layer type photoelectric conversion device.

It is desirable that the silicon-rich phase includes a silicon crystal phase. It is considered that there exists a current path in the thickness direction of the silicon composite layer through the silicon crystal phase, which is presumably one of the reasons why a good ohmic contact can be formed. Alternatively, the silicon-rich phase may include doped amorphous silicon. As well known, amorphous silicon of either n-type or p-type sufficiently doped with impurities can make a film of sufficiently low resistivity for forming the ohmic contact.

To achieve the sufficient reflection effect, the silicon composite layer has a refractive index of preferably more than 1.7 and less than 2.5, and more preferably more than 1.8 and less than 2.1, regarding light of 600 nm wavelength. When the substrate of the stacked-layer type photoelectric conversion device is transparent, it is preferable that reflected spectrum of light having transmitted the transparent substrate and reached the silicon composite layer includes at least one maximal value and at least one minimal value of reflectance in a wavelength range from 500 nm to 800 nm, and that the difference between the maximal value and the minimal value is more than 1%.

It is preferable that the silicon composite layer has dark conductivity of more than $10^{-8}$ S/cm and less than $10^{-1}$ S/cm. If the dark conductivity is too low, the fill factor (FF) of the stacked-layer type photoelectric conversion device will decrease, leading to degradation of the conversion efficiency. If the dark conductivity is too high, the leakage current will occur in the thin-film photoelectric conversion module formed of integrated stacked-layer type photoelectric conversion cells. To achieve the optimal dark conductivity, in the silicon composite layer measured by Raman scattering, an intensity ratio of the TO (optical transverse oscillation) mode peak of crystalline silicon component to the TO mode peak of amorphous silicon component is preferably in a range of more than 0.5 and less than 10. Further, the dopant atom concentration in the silicon composite layer is preferably in a range from $3\times10^{20}$ cm$^{-3}$ to $1.8\times10^{21}$ cm$^{-3}$.

The silicon composite layer preferably has an optical energy gap of at least 2.2 eV to achieve a sufficient reflection effect. Further, in the silicon composite layer measured by X-ray photoelectron spectroscopy, difference between the upper most energy of the O1s photoelectrons having suffered interband excitation loss and the peak energy of the O1s photoelectrons is preferably at least 2.2 eV.

In an integrated type photoelectric conversion module according to the present invention, a first electrode layer, a plurality of photoelectric conversion unit layers and a second electrode layer successively stacked on a substrate are separated by a plurality of isolation grooves to form a plurality of photoelectric conversion cells, and the cells are electrically connected in series with each other via a plurality of connection grooves. Each of the photoelectric conversion cells has a plurality of stacked photoelectric conversion units, each including a one conductivity-type layer, a photoelectric conversion layer of substantially intrinsic semiconductor and an opposite conductivity-type layer in this order a the light incident side. At least one of the opposite conductivity-type layer in a front photoelectric conversion unit arranged relatively closer to the light incident side and the one conductivity-type layer in the back photoelectric conversion unit arranged adjacent to that front photoelectric conversion unit includes a silicon composite layer at least in a part thereof. The silicon composite layer has a thickness of more than 20 nm and less than 130 nm and an oxygen concentration of more than 25 atomic % and less than 60 atomic %, and includes a silicon-rich phase parts in an amorphous alloy phase of silicon and oxygen.

The first electrode layer is separated into a plurality of regions corresponding to the plurality of photoelectric conversion cells by a plurality of first isolation grooves, the plurality of photoelectric conversion unit layers and the second electrode layer are separated into a plurality of regions corresponding to the plurality of cells by a plurality of second isolation grooves, and a connection groove is provided between the first isolation groove and the second isolation groove to electrically connect the first electrode of one of the cells with the second electrode of the next neighboring cell.

In the case of forming the stacked-layer type photoelectric conversion device, when the silicon composite layer is deposited in a plasma CVD reaction chamber, it is preferable that a mixing ratio of dopant source gas to silicon source gas is in a range from 0.012 to 0.07. Further, in the case of forming the stacked-layer type photoelectric conversion device, after deposition carried out up to a part of the total thickness of the silicon composite layer on the substrate in a plasma CVD reaction chamber, the substrate may be temporarily taken out to expose a surface of the silicon composite layer to the ambient air, and then after the substrate is introduced again into the plasma CVD reaction chamber, the remaining part of the total thickness of the silicon composite layer may be deposited. In this case, it is preferable that the substrate is taken out from the plasma CVD reaction chamber to the ambient air after at least 60% of the total thickness of the silicon composite layer is deposited.

Effect of the Invention

In the stacked-layer type photoelectric conversion device according to the present invention, the incident light is partially reflected at the interface between the silicon composite layer and the semiconductor layer contacting the same. This can increase the current generated by the front photoelectric conversion unit. Alternatively, the photoelectric conversion layer in the front photoelectric conversion unit can be made thinner to generate the same current as in the case that the silicon composite layer is not provided.

Since the silicon composite layer can be formed by plasma CVD similarly as in the case of the photoelectric conversion unit, the front photoelectric conversion unit, the silicon composite layer and the back photoelectric conversion unit can all be formed in the similar plasma CVD apparatus. This eliminates the need to provide a facility of another system required for forming a conventional TCO intermediate reflective layer. Accordingly, it is possible to reduce the production costs and time of the stacked-layer type photoelectric conversion device.

In the integrated type thin-film photoelectric conversion module according to the present invention, the silicon composite layer has relatively high dark conductivity in a direction parallel to the film surface. Accordingly, the patterning of the third isolation groove for separation of the conventional TCO intermediate reflective layer is not necessary, so that the production costs and time can be reduced. It is also possible to avoid reduction in the photoelectric conversion efficiency due to the loss of the power generating area because of provision of the third isolation groove.

DESCRIPTION OF THE REFERENCE CHARACTERS

1: glass substrate; 2: transparent electrode layer; 3: front photoelectric conversion unit; 3a: first photoelectric conversion unit; 4: n-type silicon composite layer; 5: back photoelectric conversion unit; 5a: second photoelectric conversion unit; 6: back electrode layer; 7: n-type silicon composite layer; 8: third photoelectric conversion unit; 31: p-type amorphous silicon carbide layer; 32, 32a: i-type amorphous silicon layer; 33: n-type microcrystalline silicon layer; 33a: n-type silicon composite layer; 33b, 33c: n-type microcrystalline silicon layer; 34: n-type silicon composite layer; 35: n-type microcrystalline silicon layer; 36: n-type microcrystalline silicon layer; 37: n-type silicon composite layer; 38: n-type microcrystalline silicon layer; 39: n-type amorphous silicon oxide layer; 51: p-type microcrystalline silicon layer; 51a: p-type silicon composite layer; 51b, 51c: p-type microcrystalline silicon layer; 52, 52a: i-type crystalline silicon layer; 53: n-type microcrystalline silicon layer; 53a: n-type silicon composite layer; 53b, 53c: n-type microcrystalline silicon layer; 81: p-type microcrystalline silicon layer; 81a: p-type silicon composite layer; 82: i-type crystalline silicon layer; 83: n-type microcrystalline silicon layer; 101: integrated type thin-film photoelectric conversion module; 102: glass substrate; 103: transparent electrode layer; 104a: front photoelectric conversion unit; 104b: back photoelectric conversion unit; 105: TCO intermediate reflective layer; 106: back electrode layer; 107: silicon composite layer; 110: photoelectric conversion cell; 121: first isolation groove; 122: second isolation groove; 123: connection groove; and 124: third isolation groove.

BEST MODES FOR CARRYING OUT THE INVENTION

To find a material having both a low refractive index and a high conductivity, the inventors concentrated on investigating a method of forming alloys of silicon and oxygen by high-frequency plasma CVD. As a result, it was found that a layer including silicon-rich phase parts in an amorphous alloy phase of silicon and oxygen (herein, called a "silicon composite layer") can have both a low refractive index and a high conductivity.

Figure 1:
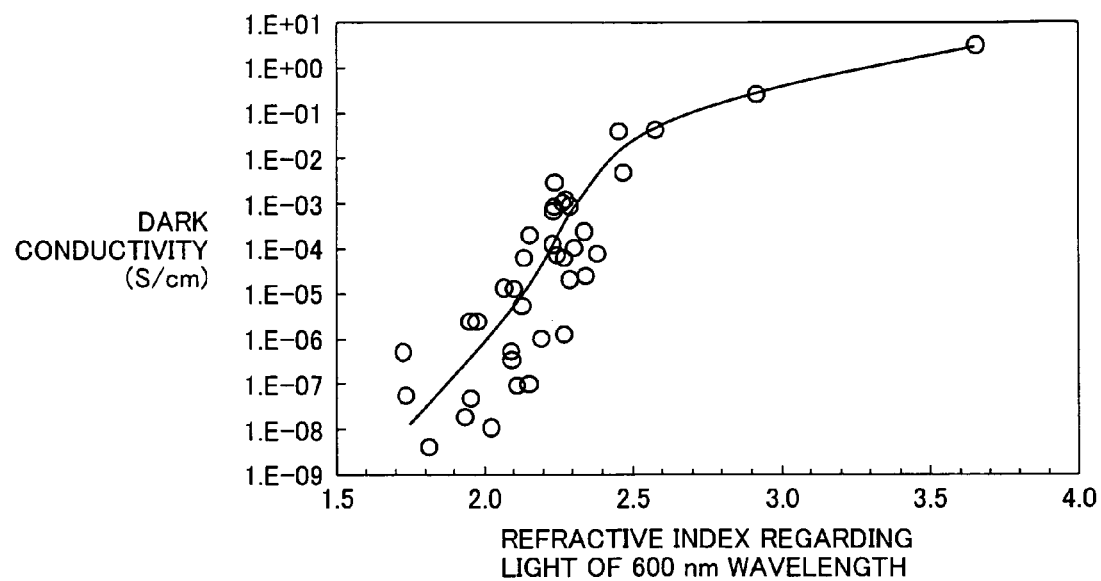
FIG. 1 is a graph showing the relation between the refractive index of the silicon composite layer regarding light of 600 nm wavelength and the dark conductivity thereof.

The graph of FIG. 1 shows the relation between the refractive index and the dark conductivity measured for the silicon composite layers formed on glass substrates. Here, spectral ellipsometry was used to measure the refractive index regarding light of 600 nm wavelength. The reason why the wavelength of 600 nm was selected is that in a hybrid-type photoelectric conversion device as one type of stacked-layer type photoelectric conversion device, the falling of the spectral sensitivity current of the amorphous photoelectric conversion unit and the rising of the spectral sensitivity current of the crystalline photoelectric conversion unit cross each other at the wavelength of around 600 nm. It can be said that the film well reflecting light of wavelength of around 600 nm, i.e., the film having a low refractive index regarding light of 600 nm wavelength, is suitable for increasing current generated by the front amorphous photoelectric conversion unit arranged closer to the light incident side.

With coplanar electrodes attached to the silicon composite layer on the substrate, the dark conductivity was measured in connection with current flowing in a direction parallel to the substrate. As a result of detailed investigation of the inventors, it was found that the low refractive index of 1.7 to 2.5 and the relatively high dark conductivity of $10^{-8}$ S/cm to $10^{-1}$ S/cm can be obtained simultaneously in the silicon composite layer, as seen from FIG. 1. Since the refractive index of amorphous silicon or crystalline silicon regarding light of 600 nm wavelength is about 4, the difference in refractive index between the silicon composite layer and the silicon layer is large, ensuring a sufficient reflection effect.

Figure 2:
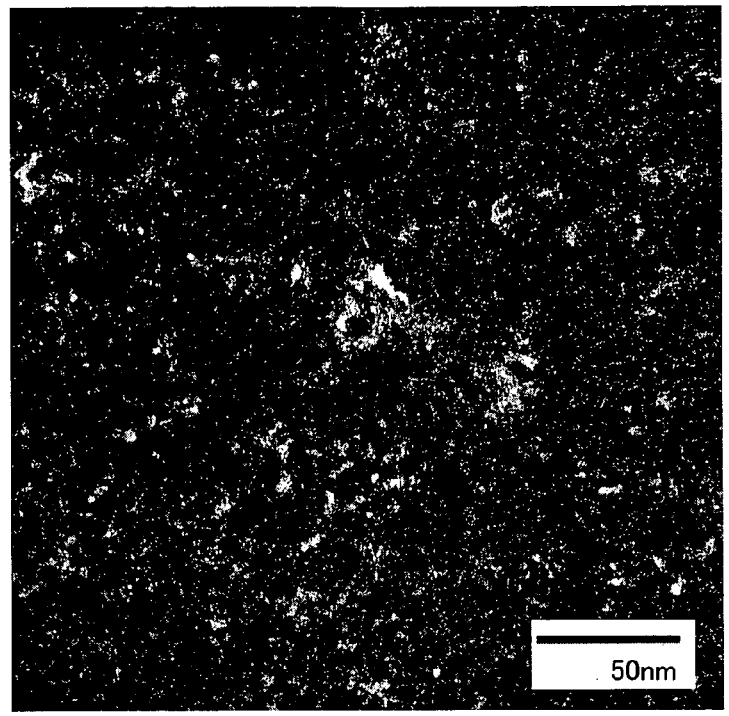
FIG. 2 is a photograph showing an example of dark field image of the silicon composite layer obtained by transmission electron microscopy.
Figure 3:
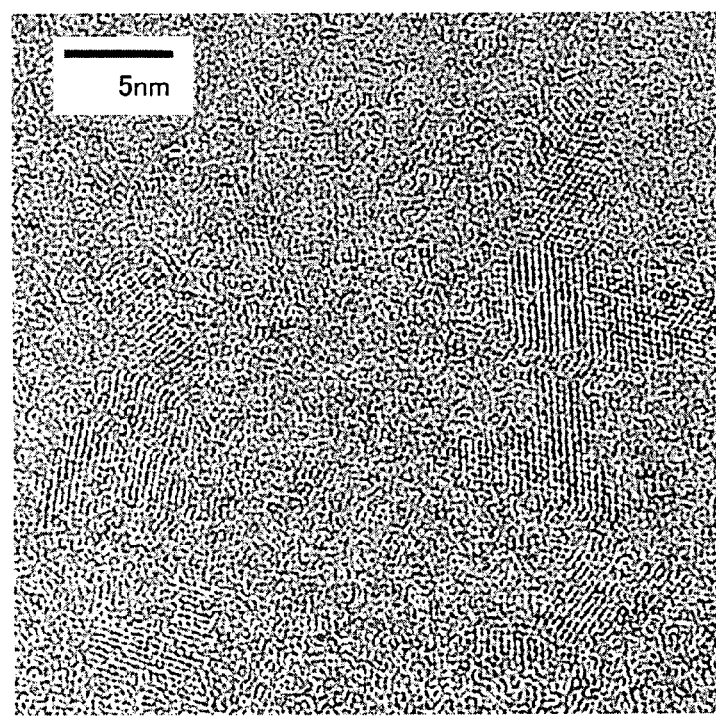
FIG. 3 is a photograph showing an example of high-resolution image of the silicon composite layer obtained by transmission electron microscopy.

As a preferred embodiment of the silicon composite layer, the silicon-rich phase can include a silicon crystal phase. FIG. 2 shows a dark field image by transmission electron microscopy (TEM) of a silicon composite layer taken out from a glass substrate, viewed from a direction perpendicular to the film surface. The dark field image is an image obtained by electron beam diffracted at a particular crystallographic plane. While diffraction does not occur in an amorphous portion, diffraction is caused by only crystals including crystallographic planes at particular Bragg angles with respect to the electron beam. Thus, the brightly imaged regions in the dark field image always correspond to crystal phase parts. This means that FIG. 2 indicates that the crystal phase parts are included in the amorphous substance. FIG. 3 is a high-resolution TEM image of the same silicon composite layer as in FIG. 2, again viewed from the direction perpendicular to the film surface. It is evident that the film contains the crystal phase parts, since it can be confirmed that there exist partial regions in which crystal lattices are arranged regularly.

Figure 4:
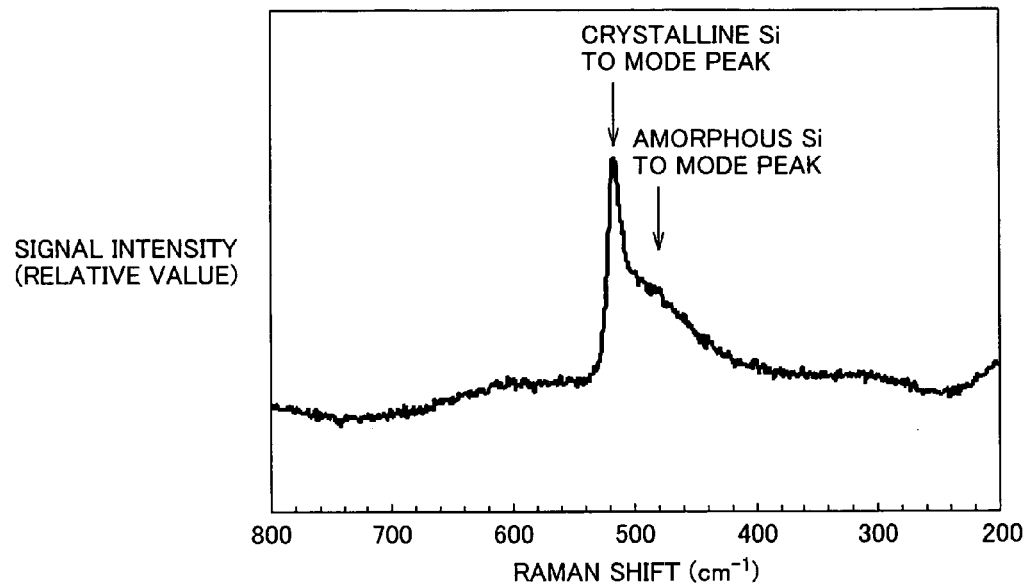
FIG. 4 is a graph showing an example of Raman scattering spectrum of the silicon composite layer.

The graph of FIG. 4 shows a Raman scattering spectrum of the silicon composite layer of FIG. 2. In this graph, there is a steep TO mode peak of crystalline silicon in the vicinity of 520 cm$^{-1}$. This means that the silicon-rich phase parts in the silicon composite layer include silicon crystals. At this time, the intensity ratio of the TO mode peak of the crystalline silicon component is 2.5 with respect to the TO mode peak of the amorphous silicon component in the vicinity of 480 cm$^{-1}$.

It has been found from experiments that the silicon composite layer having both a low refractive index and a high dark conductivity can be formed by plasma CVD, using $SiH_4$, $CO_2$, $H_2$ and $PH_3$ (or $B_2H_6$) as reaction gases, under a large ratio of $H_2/SiH_4$ for the condition for forming a microcrystalline layer, with a ratio of $CO_2/SiH_2$ set in a range from about 2 to about 10. At this time, as conditions for generating plasma, it is possible to use capacitive coupling parallel-plate electrodes, a power supply frequency of 10-100 MHz, a power density of 50-500 mW/cm$^2$, a pressure of 50-1000 Pa, and a substrate temperature of 150-250° C. With increase of the $CO_2/SiH_4$ ratio, the oxygen concentration of the silicon composite layer increases monotonously. On the other hand, it has been found through experiments that when the $CO_2/SiH_4$ ratio is changed in a range of more than 0 and less than 4, the carbon concentration of the silicon composite layer is less than 1 atomic %, indicating that carbon is hardly introduced into the film, compared to oxygen.

Figure 5:
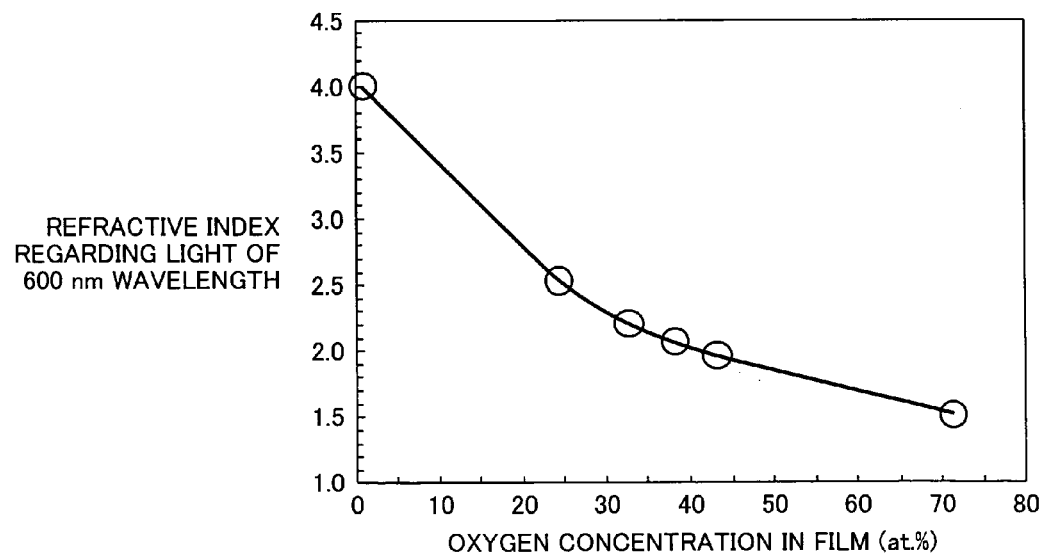
FIG. 5 is a graph showing the relation between the oxygen concentration of the silicon composite layer and its refractive index regarding light of 600 nm wavelength.

The graph of FIG. 5 shows the relation between the oxygen concentration in the silicon composite layer and the refractive index regarding light of 600 nm wavelength. As will be described later with reference to FIG. 20, to obtain the refractive index less than 2.5 of the silicon composite layer so as to increase the output current of the stacked-layer type photoelectric conversion device by the reflection effect of the silicon composite layer, the oxygen concentration may be set to exceed 25 atomic % as seen from FIG. 5. To obtain the refractive index of less than 2.1 so as to increase the output current by more than 10% by the reflection effect (see FIG. 20), the oxygen concentration may be set to exceed 40 atomic % (see FIG. 5).

The dark conductivity of the silicon composite layer is determined depending on the oxygen concentration, the doping impurity (P or B) concentration, and the proportion of the silicon crystal phase parts in the layer. The oxygen concentration is preferably 25-60 atomic % in order to adjust the dark conductivity of the silicon composite layer to $10^{-8}$ S/cm to $10^1$ S/cm and the refractive index to 1.7 to 2.5. That is, there is a preferable upper limit for the oxygen concentration of the silicon composite layer, since increase of the oxygen concentration in the silicon composite layer causes decrease of not only the refractive index but also the dark conductivity.

In the case of an n-type silicon composite layer, it is preferable to set the concentration of P as the doping impurity to more than $5 \times 10^{19}$ cm$^{-3}$ and less than $2 \times 10^{22}$ cm$^{-3}$. In the case of a p-type silicon composite layer, the concentration of B as the doping impurity is preferably set to more than $5 \times 10^{19}$ cm$^{-3}$ and less than $2 \times 10^{21}$ cm$^{-3}$. The dark conductivity of the silicon composite layer increases as the P or B concentration increases. However, when the doping impurities become excessive, the proportion of the crystal phase parts decreases, leading to undesirable decrease of the dark conductivity of the silicon composite layer. Thus, it is preferable to adjust the P or B concentration within the above-described range.

Further, as an index of the proportion of the silicon crystal phase parts in the silicon composite layer, the intensity ratio of the TO mode peak of the crystalline silicon component with respect to the TO mode peak of the amorphous silicon component measured by Raman scattering is preferably more than 0.5 and less than 10. Although the dark conductivity of the silicon composite layer increases as the peak intensity ratio increases, the proportion of the amorphous silicon oxide in the silicon composite layer decreases and the refractive index increases when the peak intensity ratio becomes too large. Thus, it is preferable to adjust the peak intensity ratio of the Raman scattering within the above-described range.

In the graph of FIG. 1, the dark conductivity varies with the same refractive index of the silicon composite layer, because conditions of oxygen concentration, impurity concentration and proportion of the silicon crystal phase parts are changed.

In the silicon composite layer of the present invention, the dark conductivity in the film thickness direction can be maintained high even if the oxygen concentration is increased to lower the refractive index to less than 2.5, since the silicon-rich phase parts presumably serves as electron transport paths in the film thickness direction. As such, provision of the silicon composite layer between the front and back photoelectric conversion units in the stacked-layer type photoelectric conversion device would only slightly affect the series resistance of the photoelectric conversion device, and thus it is possible to design a silicon composite layer having a thickness and a refractive index optimal for confinement of light. Moreover, it is readily possible to control the refractive index of the silicon composite layer by simply adjusting the oxygen concentration by changing the $CO_2/SiH_4$ gas ratio. As such, it can be expected to enhance the light confinement effect by more precise optical design, e.g., by periodically changing the refractive index in the film thickness direction.

In order to suppress the adverse effect on the series resistance of the stacked-layer type photoelectric conversion device, the conventional intermediate reflective layer formed of TCO such as ZnO is required to have high dark conductivity of $10^2$ S/cm to $10^3$ S/cm. As is generally known, it is not easy to form an ohmic contact at the interface between ZnO and amorphous or crystalline silicon. In particular, the ohmic contact is unlikely to be formed at the interface between ZnO and p-type amorphous silicon or p-type crystalline silicon. In contrast, it has been found through detailed investigation that the silicon composite layer having dark conductivity of $10^{-8}$ S/cm to $10^{-1}$ S/cm can realize a favorable ohmic contact with an amorphous or crystalline silicon photoelectric conversion unit. One conceivable reason thereof is that the silicon composite layer is a semiconductor thin film including silicon as its main component, similarly to the amorphous silicon and the crystalline silicon.

Further, one of the reasons why the favorable ohmic contact can be formed is that current paths via the silicon crystal phase parts presumably exist in the thickness direction of the silicon composite layer. While the dark conductivity in FIG. 1 was measured through current flowing in a direction parallel to the film surface, current flows mainly in the thickness direction of the silicon composite layer in the stacked-layer type photoelectric conversion device. In the TEM dark field image of FIG. 2, crystal phase parts appear as bright spots. It can be said that the silicon crystal phase parts penetrating the overall thickness of the silicon composite layer are spread in two dimensions. Thus, it is considered that even if the dark conductivity in the direction parallel to the film surface is low in the silicon composite layer introduced in the stacked-layer type photoelectric conversion device, the current flows in the thickness direction primarily through the silicon crystal phase parts, and as a result it is possible to suppress the increase of the series resistance of the stacked-layer type photoelectric conversion device.

Figure 6:
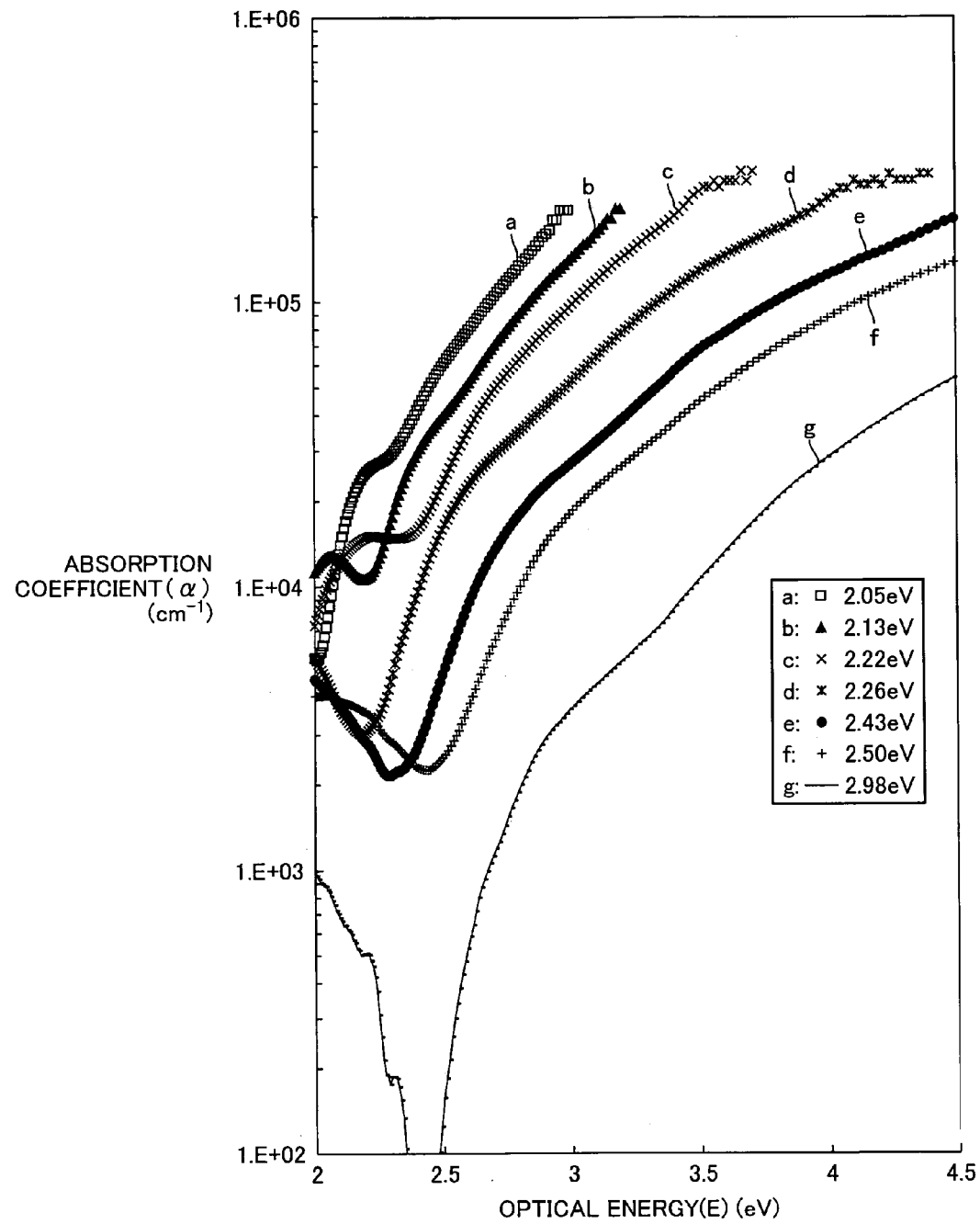
FIG. 6 is a graph showing the relation between the optical energy gap and the absorption coefficient of the silicon composite layer.

The graph of FIG. 6 shows the relation between the optical energy (E) inversely proportional to wavelength of light and the absorption coefficient ($\alpha$) regarding the silicon composite layer. In this graph, a plurality of curved lines a through g correspond to a plurality of silicon composite layers having different optical energy gaps. The optical gap reflects the forbidden bandwidth in the silicon composite layer. With a $\sqrt{(\alpha E)}$ line plotted for optical energy (E), the optical gap is obtained as an energy at an intersection between an extrapolated line of the linear portion in the plotted line and the axis of $\alpha=0$ (i.e., the optical gap is obtained from so-called Tauc's plot).

In the graph of FIG. 6, the curved lines shift to the right or downward with increase of the optical gap of the silicon composite layer, and namely the absorption coefficient exponentially decreases in comparison at the same light energy. More specifically, when the silicon composite layer is used as the intermediate reflective layer, the absorption loss can be decreased exponentially by increasing the optical gap. Compared to the case of the optical gap of 2.05 eV corresponding to the optical gap range that is disclosed as suitable in Prior Art Example 2 mentioned above, if the optical gap is set to exceed 2.2 eV, the absorption coefficient can be decreased to less than ⅓ in the wide optical energy range. In other words, the absorption loss of the stacked-layer type photoelectric conversion device can be reduced when the silicon composite layer having an optical gap of more than 2.2 eV is employed as the intermediate reflective layer.

Figure 7:
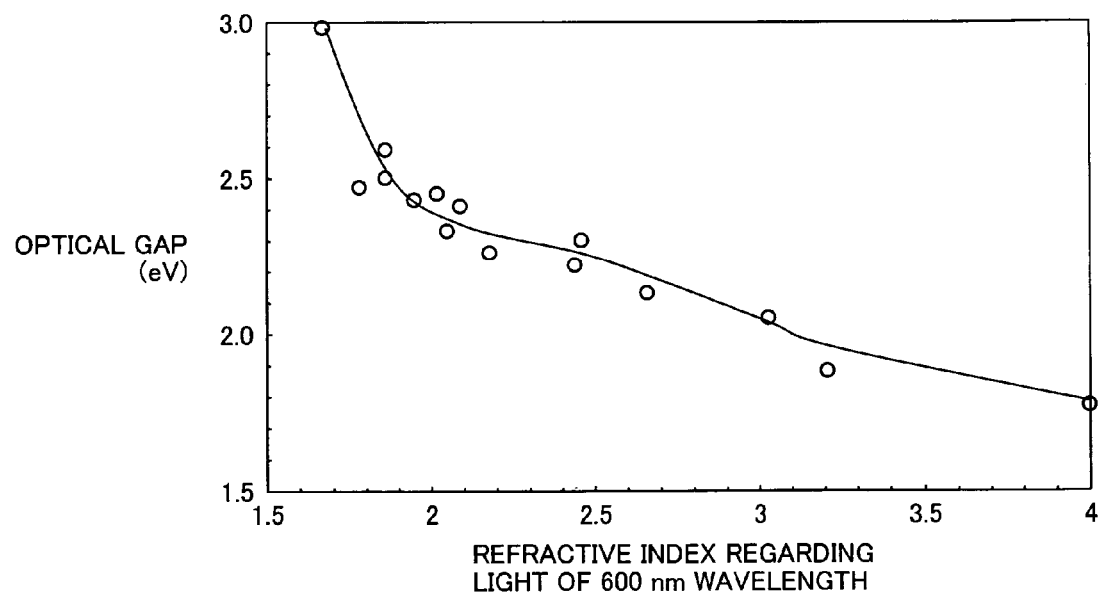
FIG. 7 is a graph showing the relation between the refractive index regarding light of 600 nm wavelength and the optical gap in the silicon composite layer.

The graph of FIG. 7 shows the relation between the refractive index regarding light of 600 nm wavelength and the optical gap in connection with the silicon composite layer. As seen from FIG. 7, the optical gap increases as the refractive index decreases, and it considerably increases in the range of the refractive index less than 2.2. If the optical gap is wide, the absorption loss due to the silicon composite layer decreases, which is preferable for improvement in properties of the stacked-layer type photoelectric conversion device. That is, when the refractive index of the silicon composite layer is set to less than 2.2, not only the reflection effect but also the effect of reducing the absorption loss because of the increase of the optical gap is enhanced, which leads to improvement in properties of the stacked-layer type photoelectric conversion device.

When a silicon composite layer having a thickness of more than 300 nm is deposited on a glass substrate, its optical gap can readily be determined from the transmission spectrum, or from the transmission spectrum and the reflection spectrum. However, it is difficult to measure the optical gap of a film having a very small thickness or the optical gap of a layer included in a stacked-layer film. Thus, measurement of X-ray photoelectron spectroscopy (XPS) was carried to obtain another index, similar to the optical gap, reflecting the forbidden bandwidth of the silicon composite layer. The graph of FIG. 8 shows the photoelectron energy loss spectrum measured by the X-ray photoelectron spectroscopy for the silicon composite layer.

Figure 8:
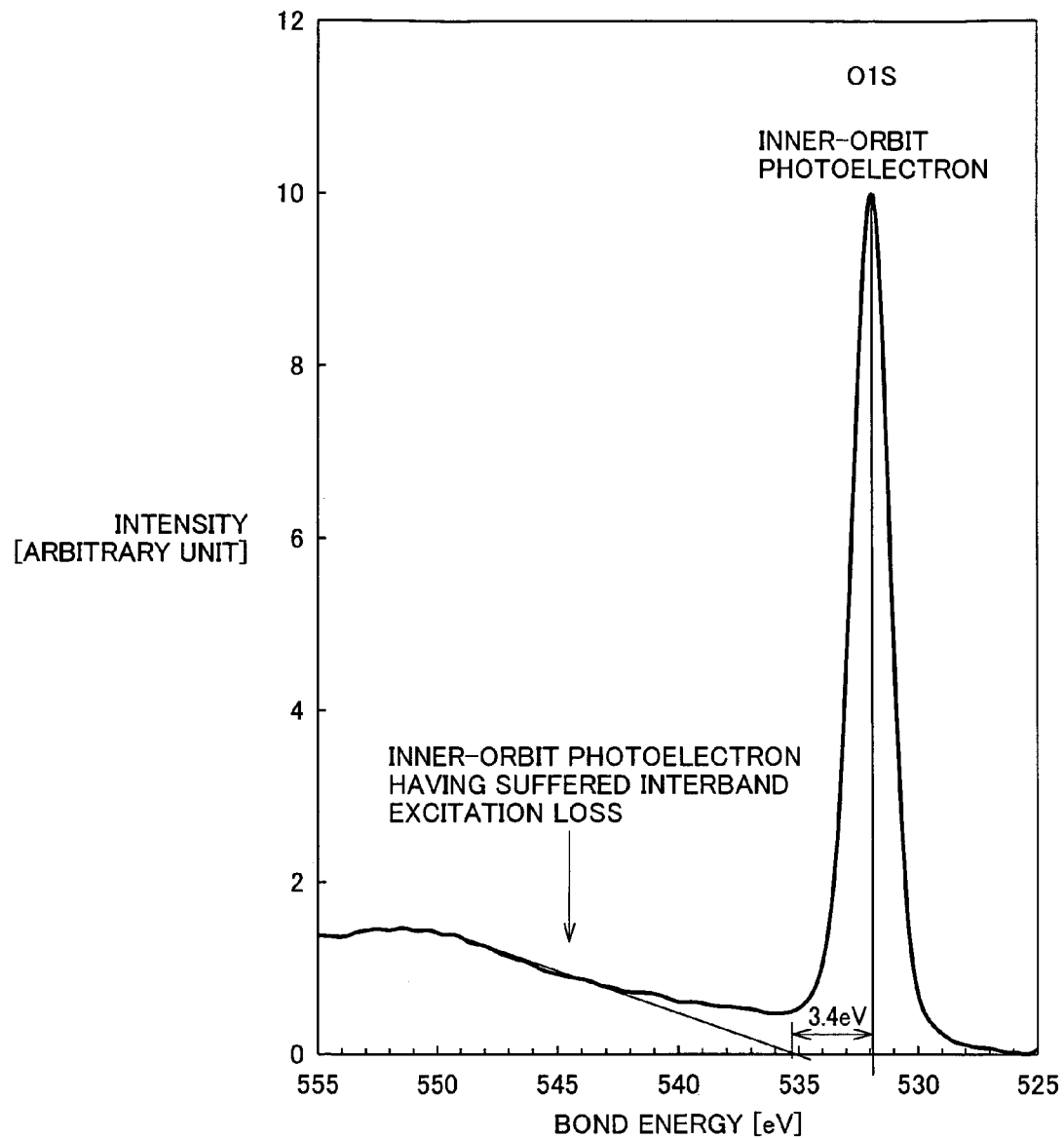
FIG. 8 is a graph showing the photoelectron energy loss spectrum of O1s measured by X-ray photoelectron spectroscopy in the silicon composite layer.

In FIG. 8, an energy difference (hereinafter, referred to as "Exps") between the upper most energy of the photoelectron having suffered interband excitation loss of O1s and the peak energy of the O1s photoelectron was obtained as the index of the forbidden bandwidth of the silicon composite layer. The X-ray photoelectron spectroscopy may be abbreviated to XPS or ESCA as well. The inner-orbit photoelectrons exited by irradiating a specimen with X-ray can provide some photoelectrons escaping into a vacuum and detected without losing their excited energy, and the other photoelectrons escaping into the vacuum and detected after at least partially loosing the excited energy in the film. The energy loss in the film is primarily attributable to interband excitation and plasmon excitation. In the case of the silicon composite layer, the plasmon excitation is about 20 eV which is sufficiently greater than that of the interband excitation, so that those signals can be separated from each other. With the linear portion in the spectrum region including the interband excitation loss being extrapolated, its crossing point with the base line was determined as the upper most energy, and then the difference between the upper most energy and the O1s peak energy was obtained as Exps. In the example of FIG. 8, Exps is 3.4 eV. XPS can be measured even for a film thinner than 10 nm. Further, if the XPS measurement is carried out while removing the film surface layer by ion sputtering, it is also possible to obtain the Exps profile in the film depth direction. According to XPS, therefore, it is possible to measure Exps even for a thin film of less than 10 nm thickness or for any layer included in the stacked-layer type photoelectric conversion device.

Figure 9:
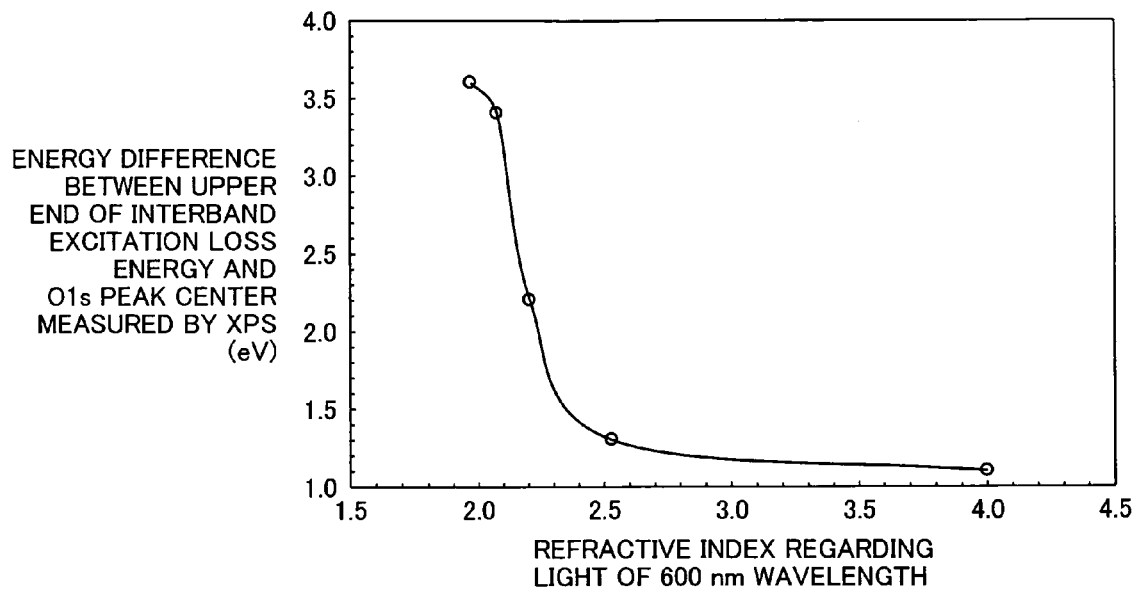
FIG. 9 is a graph showing the energy difference between the upper most energy of the photoelectron having suffered interband excitation loss of O1s and the peak energy of the O1s photoelectron measured by X-ray photoelectron spectroscopy in the silicon composite layer, in connection with the refractive index for light of 600 nm wavelength.

The graph of FIG. 9 shows the relation between the refractive index regarding light of 600 nm wavelength and Exps in connection with the silicon composite layer. As shown in this graph, Exps suddenly increases as the refractive index becomes less than about 2.2. That is, it is shown that Exps may be set to more than 2.2 eV in order to obtain the refractive index of less than 2.2 for the silicon composite layer in the stacked-layer type photoelectric conversion device, so that the current is increased by the reflection effect of the silicon composite layer. It can be said that the refractive index of less than 2.2 is preferable, not only from the standpoint of the reflection effect, but also for decreasing the absorption loss in the silicon composite layer.

As already described, in the case of employing a conventional TCO intermediate reflective layer, it was necessary for the layer to have high dark conductivity of $10^2$ S/cm to $10^3$ S/cm to suppress the adverse effect on the series resistance of the stacked-layer type photoelectric conversion device. In contrast, it has been found through detailed investigation that the silicon composite layer can realize a good ohmic contact with either of the photoelectric conversion units of amorphous silicon and crystalline silicon, despite its low dark conductivity in the direction parallel to the film surface.

Figure 32:
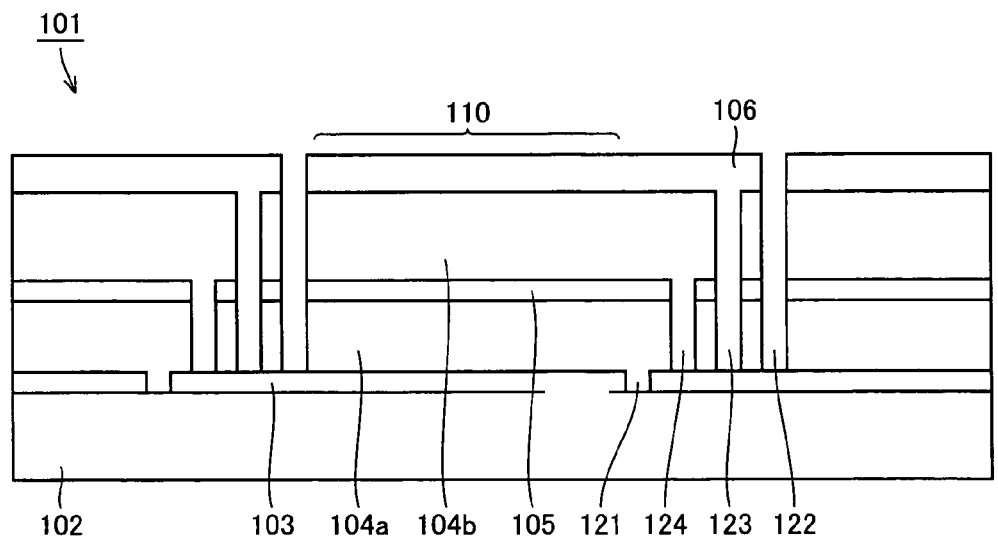
FIG. 32 is a schematic cross sectional view of a further example of a conventional integrated type photoelectric conversion module.

Since the silicon composite layer can form a favorable ohmic contact even if its dark conductivity is lower by several to ten digits than that of TCO, the structure of the integrated type photoelectric conversion module can be simplified enabling improvement in conversion efficiency of the module as well as cost reduction. That is, as will be described later in detail, in the integrated type thin-film photoelectric conversion module, even the structure unprovided with third isolation groove 124 as shown in FIG. 32 does not suffer the problem of leakage current. Thus, the number of times of patterning is decreased by 1 in the integrated type photoelectric conversion module, thereby leading to reduction of the production costs and time. Further, since the third isolation groove 124 is unnecessary, the area loss in the photoelectric conversion region can be decreased, thereby leading to improvement in conversion efficiency of the integrated type photoelectric conversion module.

As another preferred embodiment of the silicon composite layer, the silicon crystal phase parts may be undetectable in the silicon-rich phase part. That is, there is a case that the silicon-rich phase part includes only amorphous silicon.

Herein, the term "amorphous" refers to the state where the crystal phase is undetectable. It depends on plasma CVD conditions as well whether the silicon composite layer includes the silicon crystal phase parts or not. The inventors have found that, even if the silicon crystal phase parts are not detected in the silicon composite layer with a known analyzing technique, the silicon composite layer may effectively serve as the intermediate reflective layer. The following models (1)-(4) show possible reasons why the silicon composite layer can effectively serve as the intermediate reflective layer in the stacked-layer type photoelectric conversion device whether or not it includes detectable crystal phase parts.

(1) The electrons may be transported in the film thickness direction through an undetectable minute crystal phase parts or an undetectable low-density crystal phase parts within the silicon composite layer.

(2) The electrons may be transported in the film thickness direction through a silicon-rich region within the silicon composite layer. As is well known, with the impurities sufficiently doped, the n-type amorphous silicon exhibits high dark conductivity of $10^{-3}$ S/cm to $10^{-1}$ S/cm and the p-type amorphous silicon exhibits high dark conductivity of $10^{-5}$ S/cm to $10^{-2}$ S/cm.

(3) In the state immediately before generation of the crystal phase parts, a precursors of the crystals are generated in the silicon composite layer. Minute regions of lower resistivity compared to the normal amorphous substance are locally created, and accordingly, electrons can be transported in the film thickness direction. It is well known that in the case of a silicon-based thin film deposited by plasma CVD, generated crystal phase parts each grow in a columnar shape in the film thickness direction. Thus, it is considered that, even in the amorphous substance immediately before generation of the crystal phase parts, the minute regions of low resistivity grow in the film thickness direction, and electrons are likely to travel in the thickness direction.

(4) Even the silicon composite layer not including the crystal phase parts can form a good ohmic contact, probably because the silicon composite layer is a semiconductor film including silicon as its main component, similarly to the amorphous silicon and the crystalline silicon.

It is noted that presence of amorphous silicon as the silicon-rich phase can readily be confirmed, since the TO mode peak of the amorphous silicon appears in the vicinity of 480 cm$^{-1}$ in Raman scattering measurement.

Figure 10:
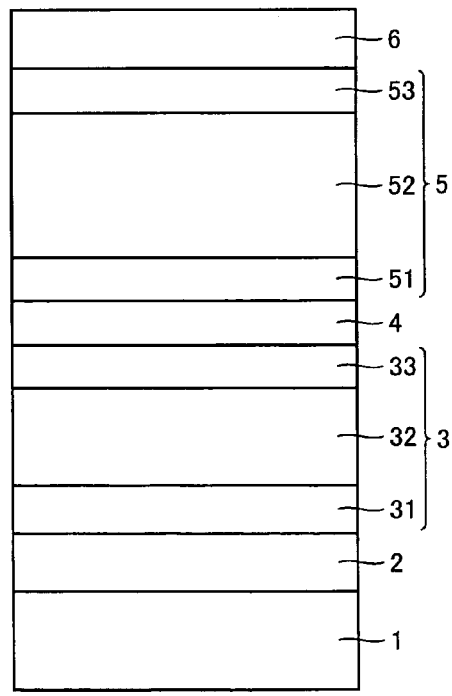
FIG. 10 is a schematic cross sectional view of a stacked-layer type photoelectric conversion device according to an embodiment of the present invention.

FIG. 10 schematically shows a cross sectional view of a stacked-layer type photoelectric conversion device according to an embodiment of the present invention. In this stacked-layer type photoelectric conversion device, a transparent electrode layer 2, an amorphous silicon photoelectric conversion unit as a first photoelectric conversion unit 3, a silicon composite layer 4 of one conductivity type (p-type or n-type), a crystalline silicon photoelectric conversion unit as a second photoelectric conversion unit 5, and a back electrode layer 6 are successively stacked on a glass substrate 1 as a transparent substrate. Although silicon composite layer 4 of the one conductivity type is shown as a layer separate from each of first photoelectric conversion unit 3 and second photoelectric conversion unit 5 in FIG. 10, it may be considered as a part of the one conductivity type (p-type or n-type) layer included in either first photoelectric conversion unit 3 or second photoelectric conversion unit 5.

For the transparent substrate, a transparent resin film or the like may be employed besides glass, though a material as transparent as possible is preferred so as to make a greater amount of sunlight transmitted to and absorbed in the photoelectric conversion layer. For the similar reason, it is preferable to form a reflection-free coating on the substrate surface from which sunlight enters, to thereby reduce the light reflection loss.

For transparent electrode layer 2, transparent conductive oxide (TCO), such as tin oxide ($SnO_2$), indium tin oxide (ITO), zinc oxide (ZnO) or the like can be used, among which $SnO_2$ is particularly preferable. Further, the interface between transparent electrode layer 2 and photoelectric conversion unit 3 preferably has unevenness having an average pitch of 200-900 nm. To this end, transparent electrode layer 2 preferably has an average grain size of 200-900 nm.

Although two photoelectric conversion units are stacked in FIG. 10, it is of course possible to stack three or more photoelectric conversion units one another, as will be described later. In the case that three or more photoelectric conversion units are stacked, only one silicon composite layer 4 may be inserted, or the layer may be inserted between every possible pair of the photoelectric conversion units.

The photoelectric conversion unit includes a one conductivity-type layer, an i-type photoelectric conversion layer of substantially intrinsic semiconductor, and an opposite conductivity-type layer. The one conductivity-type layer may be a p-type layer or an n-type layer, and correspondingly, the opposite conductivity-type layer becomes an n-type layer or a p-type layer. Since a p-type layer is normally arranged on the light incident side of the photoelectric conversion device, one conductivity-type layers 31, 51 in the structure of FIG. 10 are normally p-type layers, and opposite conductivity-type layers 33, 43 are n-type layers. I-type layers 32, 52, designed to absorb light and carry out photoelectric conversion, preferably have different band gaps or are formed of materials different in light absorption wavelength range from each other. It is preferable that the stacked-layer type photoelectric conversion device as a whole is capable of absorbing light in the main wavelength range (400-1200 nm) of sunlight. To this end, it is preferable to select a combination of an i-type amorphous silicon layer and an i-type amorphous silicon germanium layer, or a combination of an i-type amorphous silicon layer and an i-type crystalline silicon layer.

In the case that an amorphous silicon thin-film photoelectric conversion unit is formed as the front, first photoelectric conversion unit 3 in FIG. 10, although n-i-p-layers may be stacked in this order by plasma CVD, it is preferable to stack p-i-n-layers in this order from the standpoint of achieving better conversion efficiency. For example, a p-type amorphous silicon carbide layer 31 doped with boron as the conductivity type determining impurity at a dose of more than 0.01 atomic %, an i-type amorphous silicon layer 32 to be the photoelectric conversion layer, and an n-type microcrystalline silicon layer 33 doped with phosphorus as the conductivity type determining impurity at a dose of more than 0.01 atomic %, may be stacked in this order, although the constituent layers are not restricted to these examples. As the p-type layer, amorphous silicon, microcrystalline silicon, or amorphous silicon nitride may also be employed instead. As the n-type layer, amorphous silicon may also be employed instead. The one conductivity-type (p-type or n-type) layer has a thickness of preferably more than 3 nm and less than 100 nm, and more preferably more than 5 nm and less than 50 nm.

Silicon composite layer 4, one of the most important features of the present invention, serves to reflect a part of light having reached thereto into the front photoelectric conversion unit 3 located on the light incident side, and transmit the remaining part of the light to the back photoelectric conversion unit 5. When a silicon-based material is used for the photoelectric conversion layer, the refractive index of the photoelectric conversion layer regarding light of 600 nm wavelength is about 4. Thus, the refractive index of silicon composite layer 4 is preferably in the range of more than 1.7 and less than 2.5. The dark conductivity of silicon composite layer 4 is preferably more than $10^{-8}$ S/cm and less than $10^{-1}$ S/cm, since output current flows therethrough.

Figure 11:
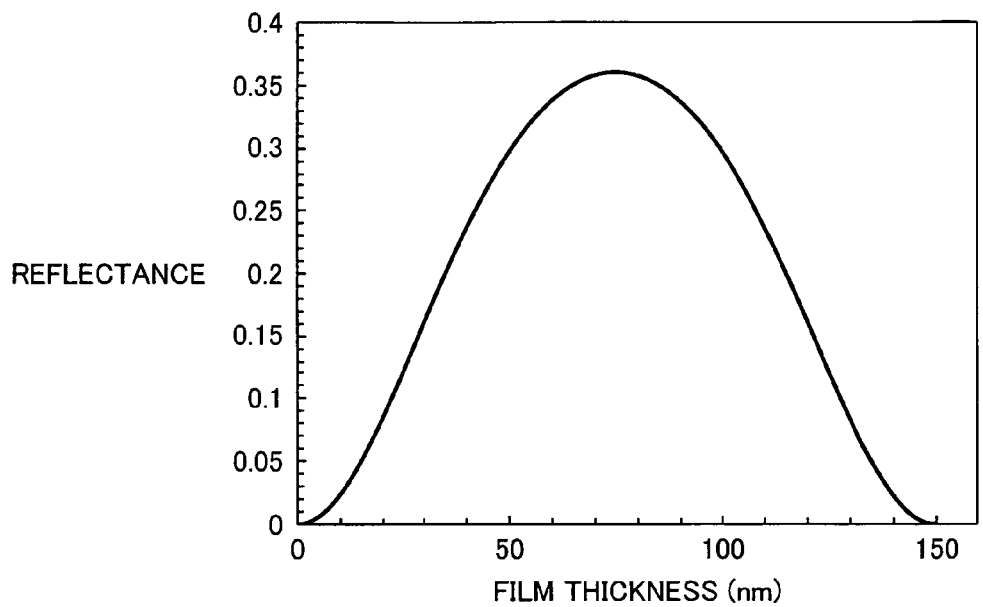
FIG. 11 is a graph showing the relation between the thickness of the silicon composite layer and the reflectance at the interface taking account of interference.

The graph of FIG. 11 shows the relation between the thickness of silicon composite layer 4 and the reflectance of light of 600 nm wavelength, taking account of interference between its both sides. At this time, the silicon composite layer has the refractive index of 2 regarding light of 600 nm wavelength. It is found from this graph that silicon composite layer 4 preferably has a thickness of more than 20 nm and less than 130 nm to cause more than 10% of light to be reflected to the front photoelectric conversion unit 3 side. It is also found that silicon composite layer 4 preferably has a thickness of more than 50 nm and less than 100 nm such that more than 30% of light is reflected to the front photoelectric conversion unit 3 side.

Front photoelectric conversion unit 3, silicon composite layer 4, and back photoelectric conversion unit 5 are preferably formed continuously, without being taken out to the ambient air. Here, "not taken out to the ambient air" means that they are kept in the environment free from surface contamination. To this end, any of various known methods may be employed.

Figure 12:
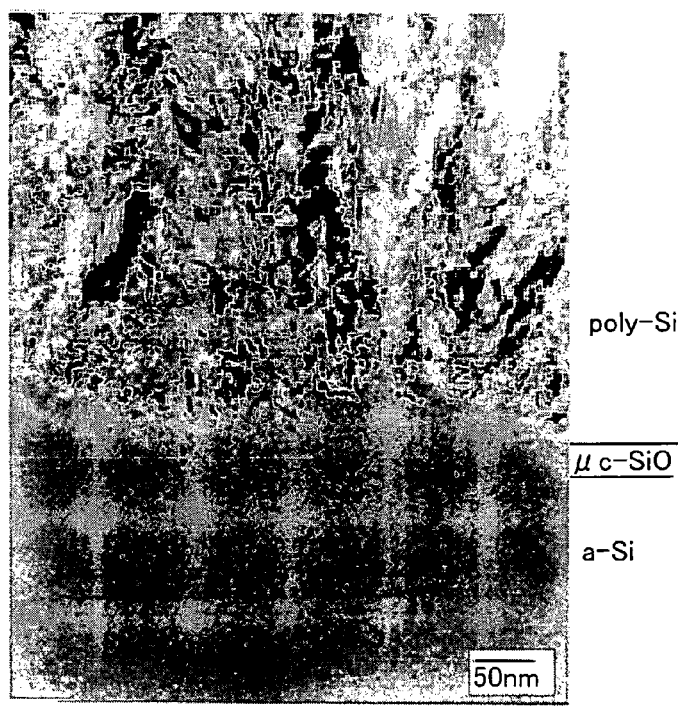
FIG. 12 is a photograph showing an example of bright field image by transmission electron microscopy of a cross section in a stacked-layer type photoelectric conversion device of the present invention.
Figure 13:
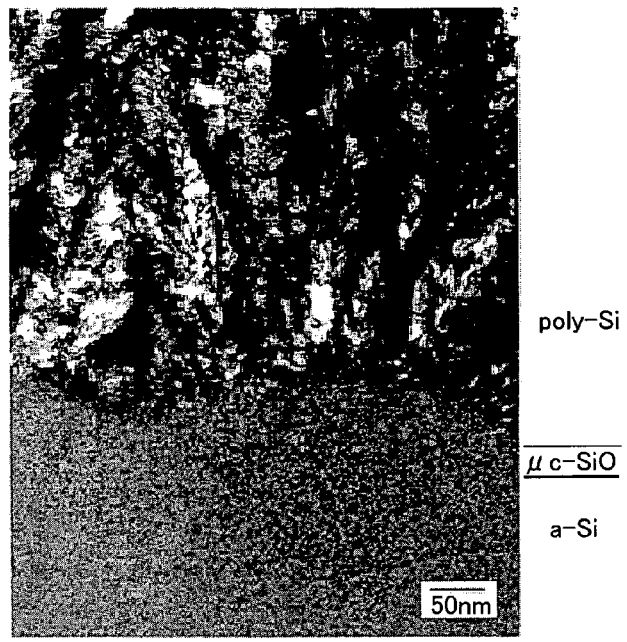
FIG. 13 is a photograph showing a dark field image corresponding to FIG. 12.

The structure and thickness of silicon composite layer 4 thus adapted to the stacked-layer type photoelectric conversion device can be analyzed with transmission electron microscopy (TEM). FIG. 12 is a bright-field TEM image of the stacked-layer type photoelectric conversion device having a structure of glass substrate/transparent electrode layer/amorphous photoelectric conversion unit/silicon composite layer/crystalline photoelectric conversion unit/back electrode layer, showing a cross section taken in the thickness direction in the vicinity of the silicon composite layer. In the bright field image of FIG. 12, the silicon composite layer (μc-SiO) is shown whitish because of its lower density as compared with the amorphous silicon layer (a-Si) and the crystalline silicon layer (poly-Si) on both sides thereof FIG. 13 is a dark field image showing the same region as that of the bright field image of FIG. 12. In this dark field image, there are minute bright parts spread through the silicon composite layer, indicating existence of minute crystal phase parts in the silicon composite layer.

The oxygen concentration and the P or B concentration of the silicon composite layer in the stacked-layer type photoelectric conversion device can be detected by using any of known analyzing methods. For example, SIMS (secondary ion mass spectrometry), ESCA (electron spectroscopy for chemical analysis), EPMA (electron probe microanalysis), or Auger electron spectroscopy can be employed to analyze the composition, after removing the back electrode layer of the stacked-layer type photoelectric conversion device by an acid such as HCl, while removing the surface layer by wet etching, plasma etching, ion sputtering or the like to change the depth of the region to be measured.

Figure 14:
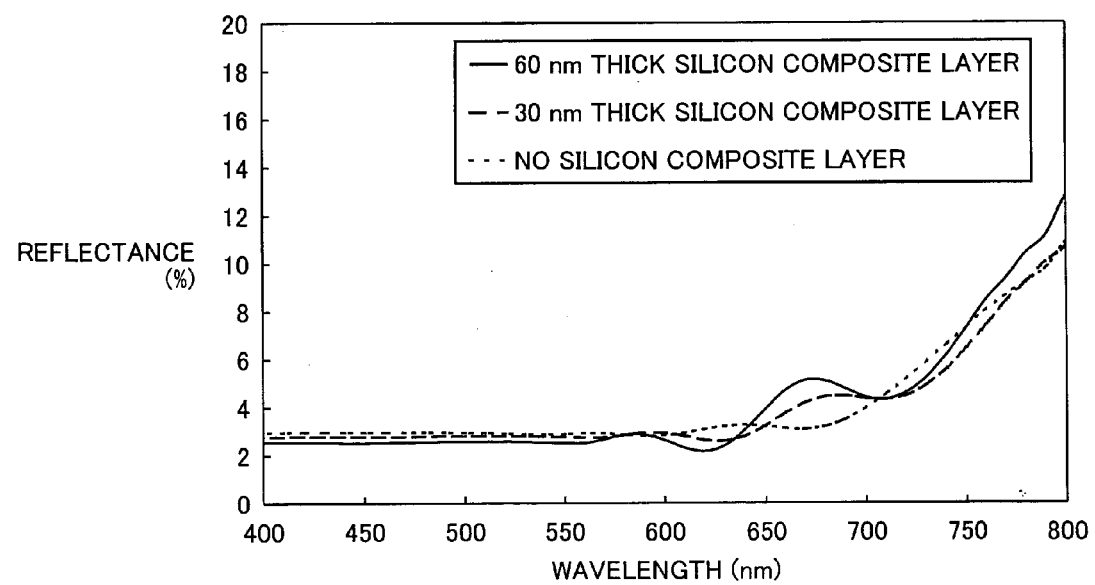
FIG. 14 is a graph showing the reflectance of light incident on the glass substrate side in the stacked-layer type photoelectric conversion device of the present invention.

Further, the refractive index of the silicon composite layer in the stacked-layer type photoelectric conversion device can be detected with ellipsometry, by exposing the silicon composite layer. Presence/absence of the silicon composite layer can readily be determined based on a difference in reflectance of light having entered from the glass substrate. The graph of FIG. 14 shows the reflection spectra of light having entered from the glass substrate side, in the stacked-layer photoelectric conversion devices including a 60 nm thick silicon composite layer, a 30 nm thick silicon composite layers, and no silicon composite layer, respectively. With provision of the silicon composite layer, light is reflected back and forth within the amorphous photoelectric conversion unit thereby causing interference, and then, a maximal reflectance value and a minimal reflectance value having a difference more than 1% therebetween appear in the wavelength range of 500-800 nm. In contrast, with no provision of the silicon composite layer, well-defined maximal and minimal reflectance values do not appear in this wavelength range.

In the case that a crystalline silicon photoelectric conversion unit, for example, is formed as second photoelectric conversion unit 5 on silicon composite layer 4 in the stacked-layer type photoelectric conversion device of FIG. 10, it is preferable that p-i-n-layers are stacked in this order by plasma CVD at a substrate temperature of lower than 400° C. That is, by forming the same at a low temperature, the crystalline silicon-based photoelectric conversion layer as i-type photoelectric conversion layer 52 preferably includes a great number of hydrogen atoms that terminate and inactivate defects in crystal grain boundaries and inside grains. Specifically, the hydrogen content of i-type photoelectric conversion layer 52 is preferably in a range of 1-15 atomic %. Further, it is preferable that the i-type layer is formed as a film of substantially intrinsic semiconductor having a density of conductivity type determining impurity atoms of less than $1 \times 10^{18}$ cm$^{-3}$.

Further, it is preferable that many of crystal grains included in i-type crystalline silicon layer 52 each grow and extend in a columnar shape in a direction approximately perpendicular to the film surface, and cause a preferential orientation plane (110) parallel to the film surface. In the case of the crystalline silicon thin film having such crystal orientation, even if the upper surface of transparent electrode 2 is substantially flat, the upper surface of photoelectric conversion unit 5 deposited thereon exhibits a textured surface structure with fine unevenness. If the upper surface of transparent electrode 2 also has a textured surface structure with unevenness, a textured structure with fine unevenness superposed on the unevenness of transparent electrode 2 is caused on the upper surface of photoelectric conversion unit 5, and thus it is possible to obtain a textured structure having a favorable light-confining effect suitable for reflecting light of a wide wavelength range. The i-type crystalline silicon layer preferably has a thickness of more than 0.1 μm and less than 10 μm. It is noted that the i-type crystalline silicon layer may be replaced with a layer of amorphous silicon germanium (containing germanium of, e.g., 30 atomic %) or crystalline silicon germanium as an alloyed material, since it is preferred that the thin-film photoelectric conversion unit is capable of absorbing light in the main wavelength range (400-1200 nm) of sunlight.

Preferably, p-type crystalline silicon layer 51 in crystalline silicon photoelectric conversion unit 5 has a thickness in a range of 3 nm to 25 nm. If p-type crystalline silicon layer 51 is thinner than 3 nm, it is not possible to generate an internal electric field sufficient for externally extracting carriers generated by light irradiation within i-type crystalline silicon photoelectric conversion layer 52. If p-type layer 51 is thicker than 25 nm, the light absorption loss is increased in p-type layer 51 itself. The thickness of n-type crystalline silicon layer 53 is preferably in a range from 3 nm to 20 nm, similarly as in the case of the p-type crystalline silicon layer.

As back electrode layer 6, at least one metal layer containing at least one of Al, Ag, Au, Cu, Pt and Cr is preferably formed by sputtering or evaporation. A TCO layer (not shown) of ITO, SnO$_2$, ZnO or the like may be formed between photoelectric conversion unit 5 and metal electrode 6.

For Example, back electrode 6 is preferably a multi-layered film having a 10 nm to 150 nm thick ZnO film and a 30 nm to 500 nm thick silver film formed in this order. If the ZnO film is thinner than 10 nm, adhesion between crystalline silicon photoelectric conversion unit 5 and silver film 6 will be poor. On the other hand, if it is thicker than 150 nm, light absorption in the ZnO film itself will increase, leading to degradation in properties of the photoelectric conversion device. Silver film 6 serves to reflect light of the longer wavelength side that can not easily be absorbed by crystalline silicon photoelectric conversion unit 5, to make the light reenter the photoelectric conversion unit 5. If silver film 6 is thinner than 30 nm, the effect as the reflective layer will considerably decrease. If it is thicker than 500 nm, the production costs will increase.

Although transparent substrate 1 has been employed in the example of FIG. 10, the stacked-layer type photoelectric conversion device may be formed of the back electrode layer, back photoelectric conversion unit, silicon composite layer, front photoelectric conversion unit and transparent electrode layer successively stacked on a non-transparent substrate, in which case also the current generated in the front photoelectric conversion unit can be increased to improve the conversion efficiency. In this case, however, each of the back photoelectric conversion unit and the front photoelectric conversion unit preferably has layers of n-i-p-types stacked in this order from the substrate side.

Hereinafter, comparative example of the conventional art and examples of the present invention will be described. Throughout the drawings, the same reference characters denote the same or corresponding portions, and descriptions thereof will not be repeated.

Firstly, comparative examples 1 and 2 according to the conventional art and examples 1-4 according to the present invention are described for a two-unit stacked-layer type photoelectric conversion device. Table 1 shows properties of the stacked-layer type photoelectric conversion devices of Comparative Examples 1, 2 and Examples 1-4. Each photoelectric conversion device has an effective area of 1 cm$^2$, and its output properties were measured at 25° C. with irradiation of AM 1.5 light at 100 mW/cm$^2$. In Table 1, the open-circuit voltage (Voc), shorted-circuit current density (Jsc), fill factor (FF) and conversion efficiency (Eff) are shown for each photoelectric conversion device. Also shown in Table 1 are the output current of the front photoelectric conversion unit, the output current of the back photoelectric conversion unit, and the total output current obtained by spectral sensitivity measurement, which are shown as relative values normalized with the values of Comparative Example 1.

device of Comparative Example 2 has a structure similar to that of Prior Art Example 2 described above, except that its back photoelectric conversion unit is a crystalline photoelectric conversion unit. N-type amorphous silicon oxide layer 39 was formed under conditions of a gas flow rate ratio of $SiH_4/CO_2/PH_3/H_2=5/2.5/0.1/100$ sccm, a power supply frequency of 13.56 MHz, a power density of 20 mW/cm$^2$, a pressure of 100 Pa, and a substrate temperature of 200° C. The obtained amorphous silicon oxide layer 39 had an oxygen concentration of 18 atomic %, a refractive index of 3.0 regarding light of 600 nm wavelength, and a dark conductivity of $1.2\times10^{-6}$ S/cm. Then, its intensity ratio of the TO mode peak of crystalline silicon component to the TO mode peak of amorphous

TABLE 1

| | N-type layer of front photoelectric conversion unit | Intermediate reflective layer | Voc (V) | Jsc (mA/cm$^2$) | FF | Eff (%) | Spectral sensitivity current (normalized with Comp. Ex. 1) | | |
|---|---|---|---|---|---|---|---|---|---|
| | | | | | | | Front photoelectric conversion unit | Back photoelectric conversion unit | Total |
| Comp. Ex. 1 | Microcrystalline silicon | — | 1.353 | 11.61 | 0.734 | 11.53 | 1.00 | 1.00 | 1.00 |
| Comp. Ex. 2 | Amorphous silicon oxide | — | 1.354 | 11.64 | 0.730 | 11.51 | 0.99 | 1.01 | 1.00 |
| Ex. 1 | Microcrystalline silicon | N-type silicon composite layer | 1.338 | 12.71 | 0.701 | 11.92 | 1.09 | 1.06 | 1.08 |
| Ex. 2 | Silicon composite layer | — | 1.340 | 13.29 | 0.692 | 12.32 | 1.14 | 1.15 | 1.14 |
| Ex. 3 | Silicon composite layer/ Microcrystalline silicon | — | 1.346 | 13.04 | 0.721 | 12.65 | 1.12 | 1.08 | 1.12 |
| Ex. 4 | Microcrystalline silicon/ Silicon composite layer/ Microcrystalline silicon | — | 1.350 | 12.96 | 0.732 | 12.80 | 1.07 | 1.11 | 1.10 |

COMPARATIVE EXAMPLE 1

Figure 15:
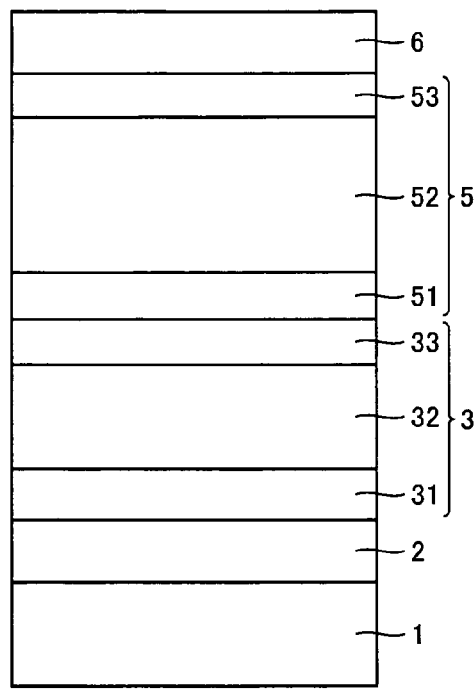
FIG. 15 is a schematic cross sectional view of a conventional stacked-layer type photoelectric conversion device.

A stacked-layer type photoelectric conversion device as shown in FIG. 15 was fabricated as Comparative Example 1. Firstly, on a 1.1 mm thick glass substrate 1 of 127 mm square, a SnO$_2$ film having surface unevenness with small pyramids and an average thickness of 800 nm was formed as a transparent electrode layer 2 by thermal CVD. The obtained transparent electrode layer 2 had a sheet resistivity of about 9 Ω/□. Its Haze ratio measured with a C light source was 12%, and the average level difference d of the surface unevenness was about 100 nm. A front photoelectric conversion unit 3 including a 15 nm thick p-type amorphous silicon carbide layer 31, a 0.3 μm thick i-type amorphous silicon layer 32, and a 30 nm thick n-type microcrystalline silicon layer 33 was formed on transparent electrode layer 2 by plasma CVD, followed by formation of a back photoelectric conversion unit 5 including a 15 nm thick p-type microcrystalline silicon layer 51, a 2.5 μm thick i-type crystalline silicon layer 52, and a 15 nm thick n-type microcrystalline silicon layer. Thereafter, a 90 nm thick Al-doped ZnO film and a 300 nm thick Ag film were successively formed as a back electrode layer 6 by sputtering.

COMPARATIVE EXAMPLE 2

Figure 16:
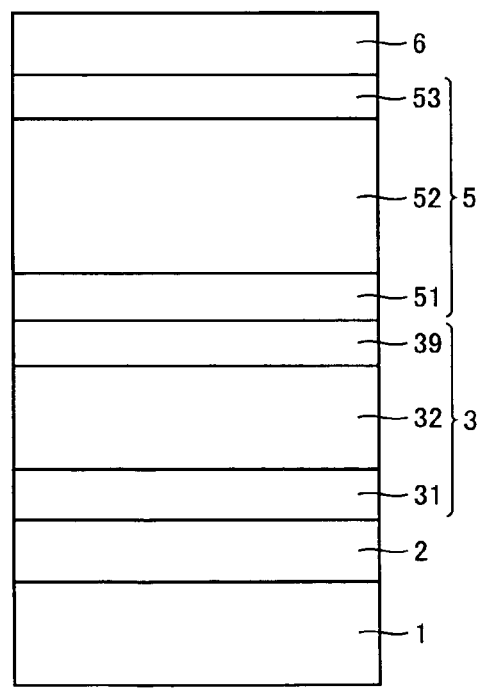
FIG. 16 is a schematic cross sectional view of another conventional stacked-layer type photoelectric conversion device.

A stacked-layer type photoelectric conversion device as shown in FIG. 16 was fabricated as Comparative Example 2. The device of Comparative Example 2 of FIG. 16 is identical to the device of Comparative Example 1 except that n-type microcrystalline silicon layer 33 in FIG. 15 is replaced with a 30 nm thick n-type amorphous silicon oxide layer 39. The silicon component measured by Raman scattering was 0 indicating that there is no crystal phase.

As seen from Table 1, Comparative Example 2 has properties similar to those of Comparative Example 1, exhibiting no increase of Jsc and no significant change in the spectral sensitivity current of the front photoelectric conversion unit. It thus can be said that n-type amorphous silicon oxide layer 39 having the oxygen concentration of 18 atomic % does not have the effect of reflecting light to the front photoelectric conversion unit 3 side. In other words, it can be said that it is hardly possible to obtain the reflection effect with this n-type amorphous silicon oxide layer 39, since its refractive index is as high as 3.0, only slightly different from those of the amorphous silicon layer and the crystalline silicon layer.

EXAMPLE 1

A stacked-layer type photoelectric conversion device as shown in FIG. 10 was fabricated as Example 1. The device of Example 1 differs from the device of Comparative Example 1 of FIG. 15 only in that a 30 nm thick n-type silicon composite layer 4 is formed between front and back photoelectric conversion units 3 and 5. This n-type silicon composite layer 4 may be considered as a part of the n-type layer included in front photoelectric conversion unit 3.

N-type silicon composite layer 4 was formed under conditions of a gas flow rate ratio of $SiH_4/CO_2/PH_3/H_2=5/10/0.1/1000$ sccm, a power supply frequency of 13.56 MHz, a power density of 100 mW/cm$^2$, a pressure of 100 Pa, and a substrate temperature of 200° C. The obtained n-type silicon composition layer 4 had an oxygen concentration of 42 atomic %, an optical gap of 2.37 eV, Exps of 3.5 eV measured by XPS, and a refractive index of 2.0 regarding light of 600 nm wavelength. Then, its intensity ratio of the TO mode peak of crystalline silicon component to the TO mode peak of amorphous silicon component measured by Raman scattering was 2.0, and its dark conductivity was $5\times10^{-6}$ S/cm.

As seen from Table 1, although FF is slightly decreased in Example 1 compared to Comparative Example 1, Jsc is increased by more than 1 mA/cm$^2$ and Eff is improved. The spectral sensitivity current of the front photoelectric conversion unit is increased by 9%, indicating that silicon composite layer 4 effectively reflects the incident light to the front photoelectric conversion unit side. Further, the spectral sensitivity current of the back photoelectric conversion unit is also increased by 6%. It is considered that the light scattering caused by silicon composite layer 4 also results in the extended optical path length within the back photoelectric conversion unit.

EXAMPLE 2

Figure 17:
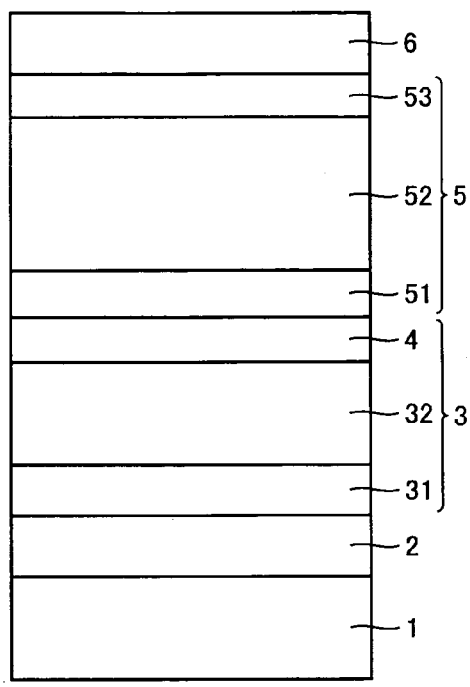
FIG. 17 is a schematic cross sectional view of a stacked-layer type photoelectric conversion device according to another embodiment of the present invention.

A stacked-layer type photoelectric conversion device as shown in FIG. 17 was fabricated as Example 2. The device of Example 2 differs from the device of Example 1 of FIG. 10 only in that a 30 nm thick n-type silicon composite layer 4 is employed as the n-type layer of front photoelectric conversion unit 3 to serve both as the intermediate reflective layer and the n-type layer.

As seen from Table 1, in Example 2 compared to Example 1, Jsc is further increased and Eff is further improved, and the spectral sensitivity currents of both the front and back photoelectric conversion units are increased, presumably for the following reason. Since silicon composite layer 4 also serves as the n-type layer of front photoelectric conversion unit 3, light reflected to the front photoelectric conversion unit 3 side and light transmitted to the back photoelectric conversion unit 5 side are both unnecessary to transmit the 30 nm thick n-type microcrystalline silicon layer, resulting in decrease of the absorption loss. However, it is noted that FF is decreased in Example 2 compared to Comparative Example 1 and Example 1, and it is considered that the contact resistance is increased at the interface between i-type amorphous silicon layer 32 and silicon composite layer 4.

Figure 33:
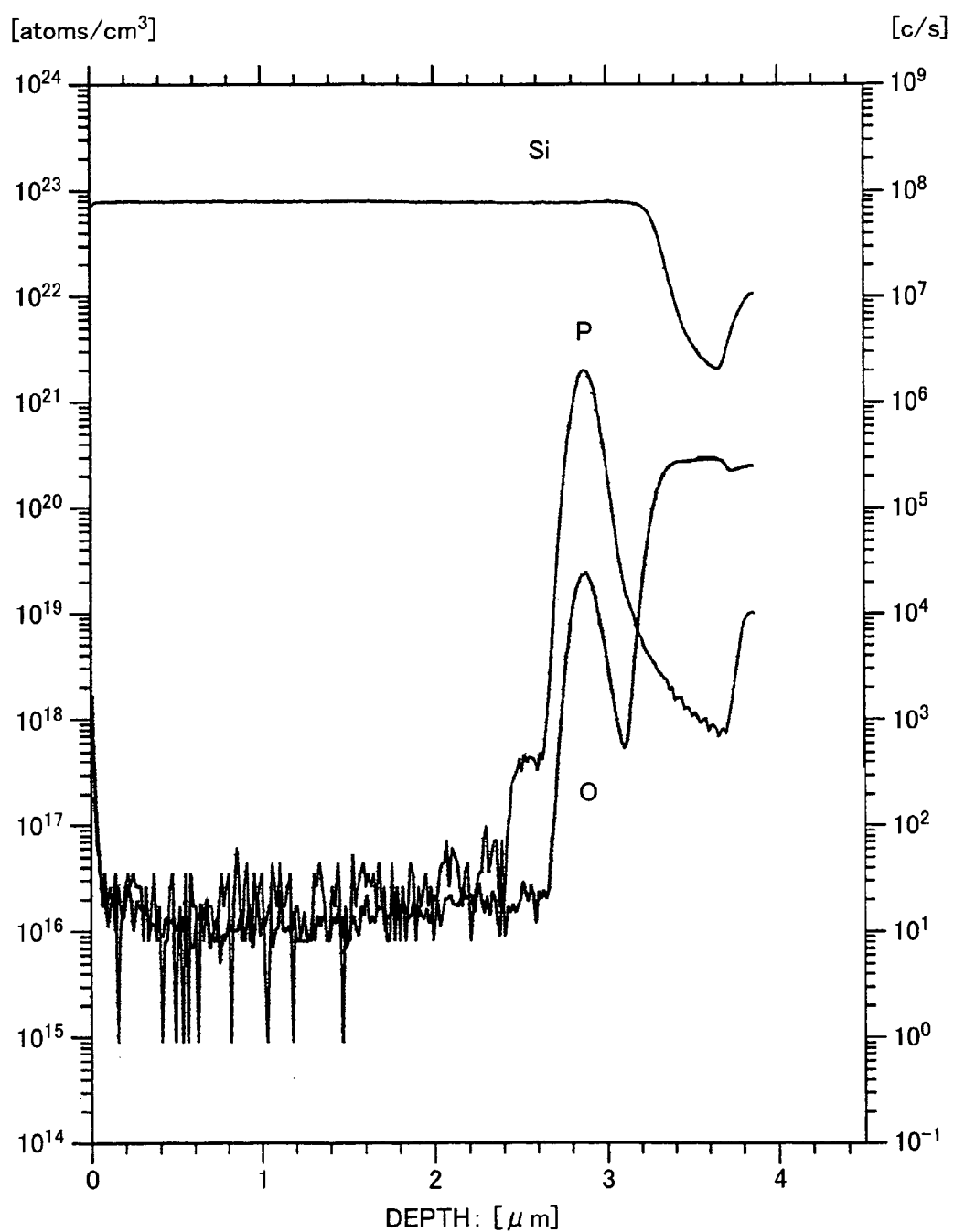
FIG. 33 is a graph showing distribution of phosphorus concentration and oxygen concentration by SIMS for a stacked-layer type photoelectric conversion device according to an embodiment of the present invention.

A graph of FIG. 33 shows distribution of phosphorus concentration and oxygen concentration measured by SIMS in the thickness direction of the photoelectric conversion device having the stacked-layer structure shown in FIG. 17. A horizontal axis in this graph represents the distance (μm) in the thickness direction, a left vertical axis represents the atomic concentration (cm$^{-3}$), and a right vertical axis represents the number of counts per second (c/s) of SIMS. Back surface electrode 6 was removed in advance by wet etching with hydrochloric acid, and the phosphorus concentration and the oxygen concentration were measured in the depth (thickness) direction by SIMS, while conducting ion sputtering toward the substrate 1. As shown in the graph of FIG. 33, phosphorus and oxygen have clear peaks at the same location in the depth direction, which means that there exists an n-type silicon composite layer.

Figure 34:
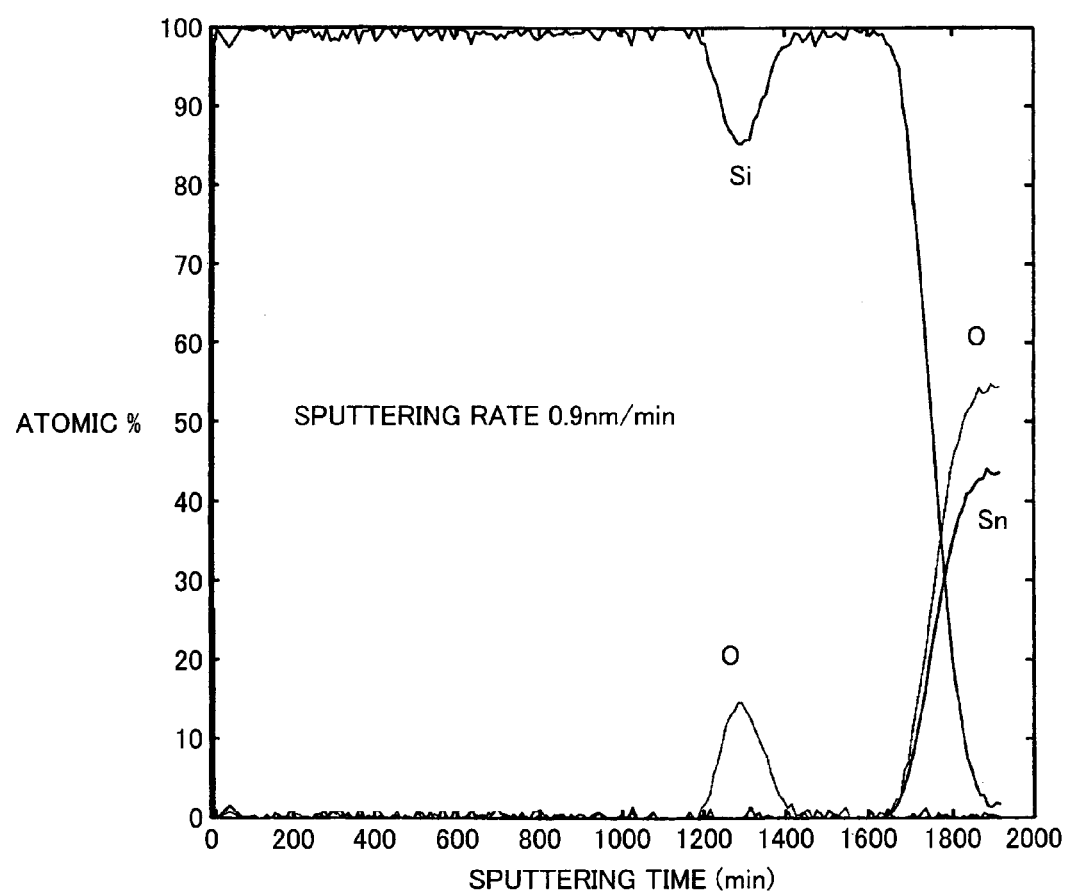
FIG. 34 is a graph showing distribution of oxygen concentration by XPS for a stacked-layer type photoelectric conversion device according to another embodiment of the present invention.

A graph of FIG. 34 shows distribution of oxygen concentration measured by XPS in the thickness direction of the photoelectric conversion device having the stacked-layer structure of FIG. 17. A horizontal axis in this graph represents the sputtering time (min) in the thickness direction, and a vertical axis represents the atomic %. The silicon composite layer included in the stacked-layer type photoelectric conversion device measured by XPS had a thickness of 50 nm and refractive index of 2.18. Back surface electrode 6 was removed in advance by wet etching with hydrochloric acid, and the oxygen concentration in the depth (thickness) direction was measured by XPS, while conducting ion sputtering toward the substrate 1. As shown in the graph of FIG. 34, the oxygen concentration has a clear peak, proving the existence of the silicon composite layer. The peak value of the oxygen concentration in this graph is about 15 atomic %, and its half width is about 110 nm. Taking the actual thickness of 50 nm of the silicon composite layer into consideration, it is found that the oxygen concentration of the silicon composite layer measured by XPS is 33 atomic %, because (15 atomic %)×(110 nm/50 nm)=33.

EXAMPLE 3

Figure 18:
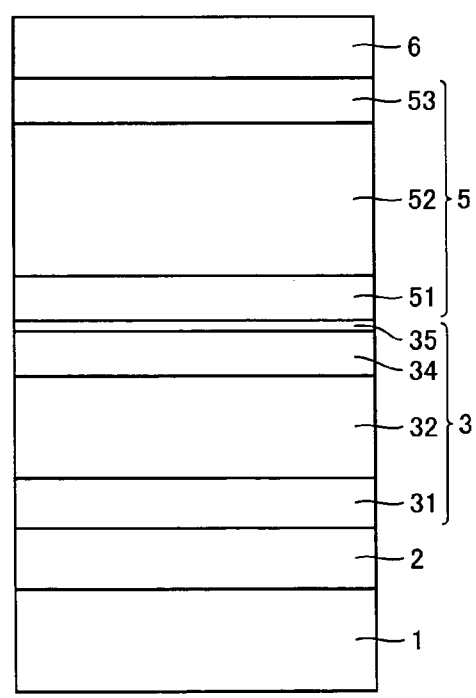
FIG. 18 is a schematic cross sectional view of a stacked-layer type photoelectric conversion device according to a further embodiment of the present invention.

A stacked-layer type photoelectric conversion device as shown in FIG. 18 was fabricated as Example 3. The device of Example 3 differs from the device of Example 2 of FIG. 17 only in that the n-type layer of front photoelectric conversion unit 3 is formed by stacking a 30 nm thick n-type silicon composite layer 34 as a first n-type layer and a 5 nm thick n-type microcrystalline silicon layer 35 as a second n-type layer. Needless to say, the n-type silicon composite layer 34 of Example 3 is formed under plasma CVD conditions similar to those for n-type silicon composite layer 4 in Examples 1 and 2.

As seen from Table 1, although Jsc in Example 3 is slightly decreased compared to Example 2, FF and Eff are improved. Further, although the spectral sensitivity current of the front photoelectric conversion unit in Example 3 is slightly lower than that of Example 2, it is higher than those of Comparative Example 1 and Example 1. This is presumably because insertion of n-type microcrystalline silicon layer 35 between n-type silicon composite layer 34 and p-type microcrystalline silicon layer 51 has decreased the contact resistance at the n/p interface, resulting in improvement of FF. Incidentally, the decrease of Jsc in Example 3 compared to Example 2 is not large, because n-type microcrystalline silicon layer 35 inserted in Example 3 is as thin as 5 nm.

EXAMPLE 4

Figure 19:
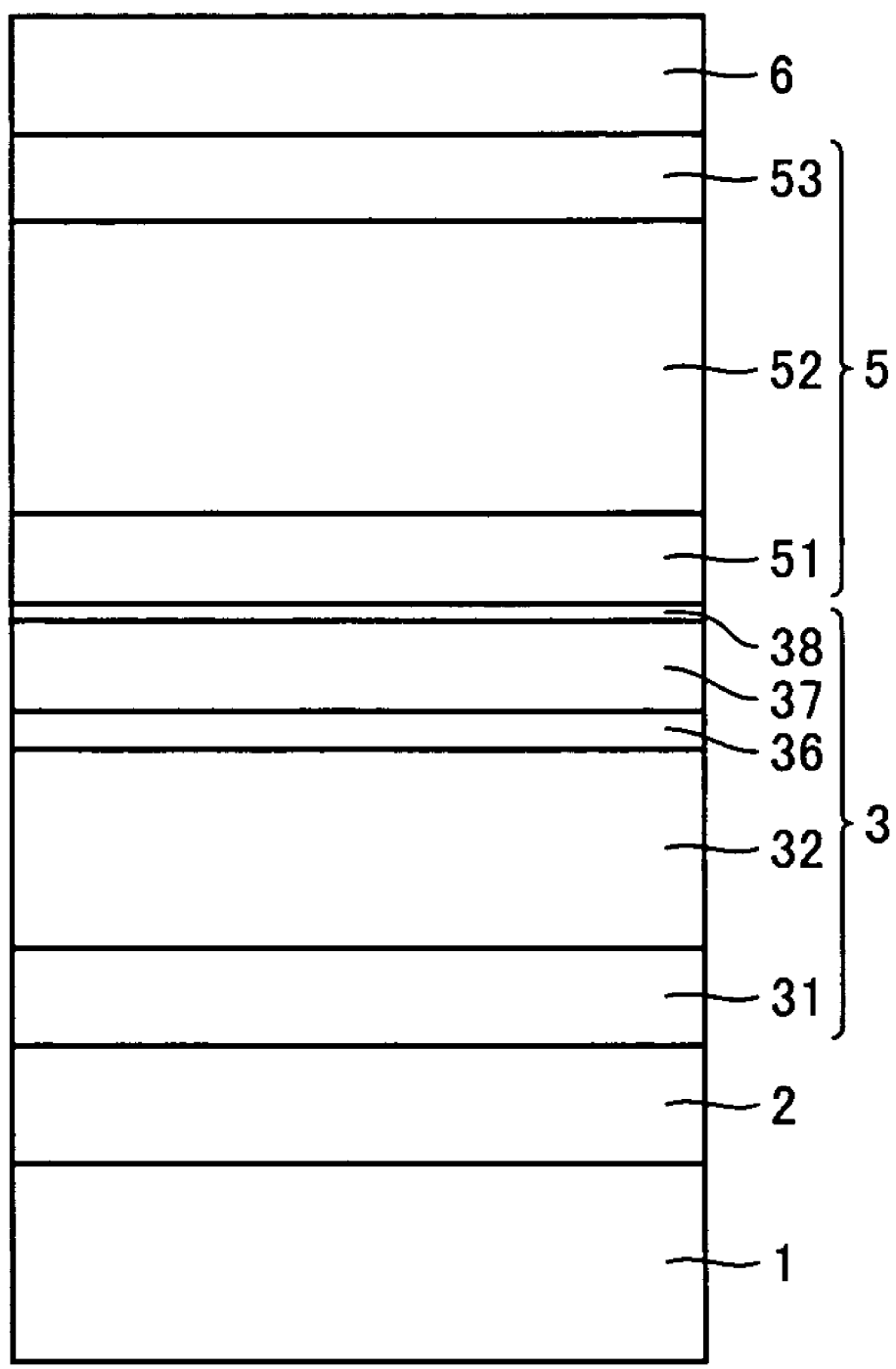
FIG. 19 is a schematic cross sectional view of a stacked-layer type photoelectric conversion device according to yet another embodiment of the present invention.

A stacked-layer type photoelectric conversion device as shown in FIG. 19 was fabricated as Example 4. The device of Example 4 differs from the device of Example 2 of FIG. 17 only in that the n-type layer of front photoelectric conversion unit 3 is formed by stacking a 10 nm thick n-type microcrystalline silicon layer 36 as a first n-type layer, a 60 nm thick n-type silicon composite layer 37 as a second n-type layer and a 5 nm thick n-type microcrystalline silicon layer 38 as a third n-type layer.

As seen from Table 1, although Jsc in Example 4 is slightly decreased compared to Example 3, FF and Eff are improved. This is presumably because n-type microcrystalline silicon layer 36 inserted between i-type amorphous silicon layer 32 and n-type silicon composite layer 37 has decreased the contact resistance at the i/n interface, and thus FF is further improved compared to Example 3. In Example 4, n-type microcrystalline silicon layer 36 and n-type microcrystalline silicon layer 38, excluding n-type silicon composite layer 37, have a total thickness of only 15 nm, which is thinner than 30 nm thick n-type microcrystalline silicon layer 33 of Example 1. This decreases the absorption loss, and Jsc is increased even compared to Example 1.

EXAMPLE 5

Figure 20:
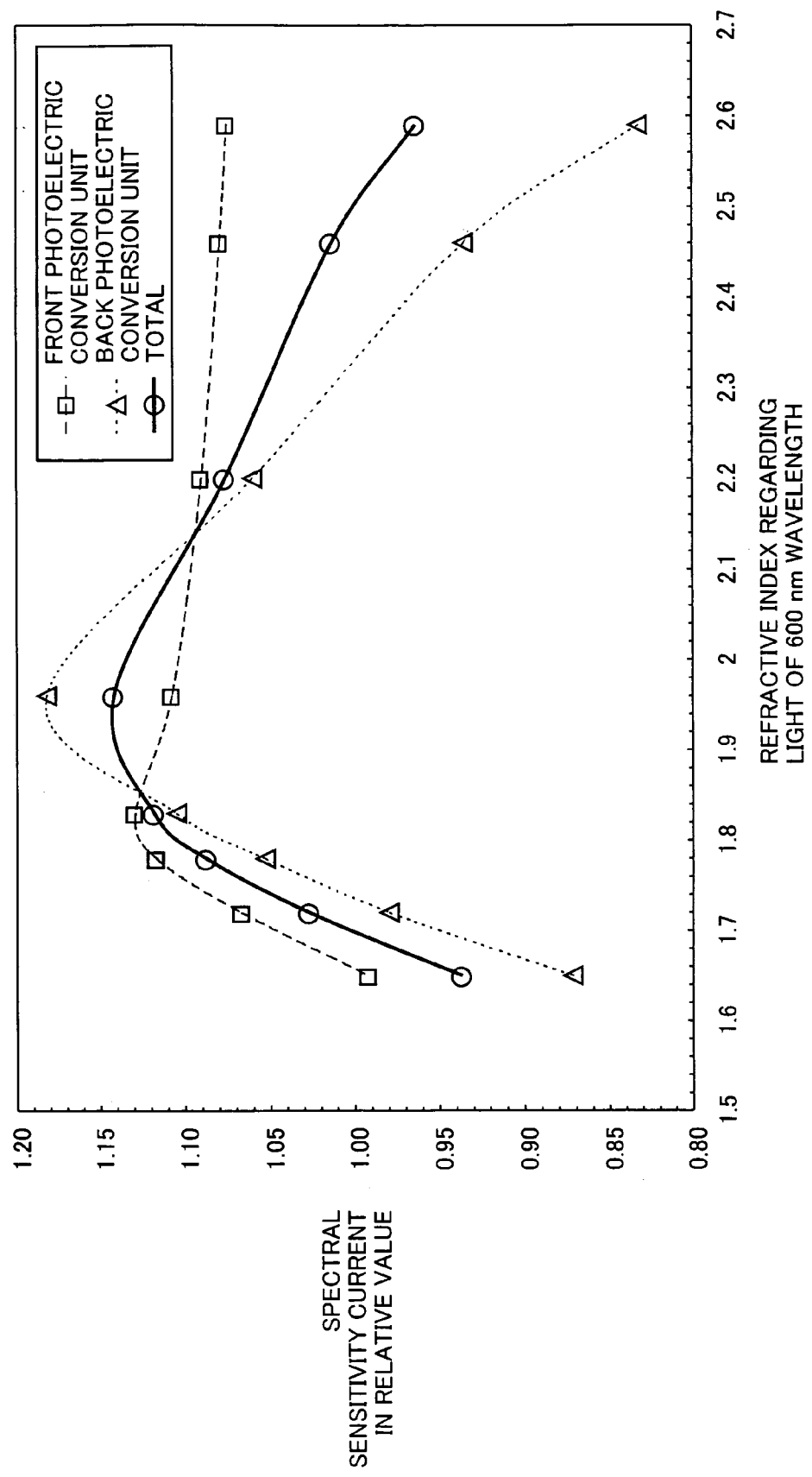
FIG. 20 is a graph showing the relative value of spectral sensitivity current in the stacked-layer type photoelectric conversion device according to the present invention.

As Example 5, shown in a graph of FIG. 20 are relative values of the spectral sensitivity currents in the case of changing the refractive index of silicon composite layer 4 in the stacked-layer type photoelectric conversion device having the structure shown in FIG. 17. Silicon composite layer 4 in Example 5 was formed in a similar manner as in Examples 1 and 2, except that the $CO_2/SiH_4$ ratio was changed within a range of 1 to 15 upon plasma CVD. In this graph, a horizontal axis represents the refractive index of silicon composite layer 4 regarding light of 600 nm wavelength, and a vertical axis represents the relative value of the spectral sensitivity current in the device of Example 5, compared to that of Comparative Example 1 of FIG. 15 provided with no silicon composite layer.

As shown in FIG. 20, the spectral sensitivity current of front photoelectric conversion unit 3 increases according to decrease of the refractive index of silicon composite layer 4, and decreases when the refractive index becomes smaller than about 1.8, probably for the following reasons. With decrease of the refractive index of silicon composite layer 4, light reflected to the front photoelectric conversion unit 3 increases, leading to increase of the spectral sensitivity current. When the refractive index becomes smaller than about 1.8, however, the dark conductivity of silicon composite layer 4 decreases, and then the resistivity of silicon composite layer 4 as well as the contact resistance at the interface considerably increases, resulting in decrease of the current.

The spectral sensitivity current of back photoelectric conversion unit 5 also increases according to decrease of the refractive index of silicon composite layer 4, and decreases as the refractive index becomes smaller than about 2. Since the transmittance of silicon composite layer 4 increases with decrease of the refractive index, light reaching the back photoelectric conversion unit 5 increases, thereby increasing the current. When the refractive index of silicon composite layer 4 becomes smaller than about 2, light reflected to front photoelectric conversion unit 3 increases, and correspondingly, light reaching back photoelectric conversion unit 5 decreases considerably, which results in decrease of the current of back unit 5.

As seen from FIG. 20, the total spectral sensitivity current of front and back photoelectric conversion units 3 and 5 has its maximal value dependent on the refractive index. When the refractive index of silicon composite layer 4 is in a range from 1.7 to 2.5, the total spectral sensitivity current of the stacked-layer type photoelectric conversion device of Example 5 increases as compared to Comparative Example 1. In order to increase the total spectral sensitivity current of the stacked-layer type photoelectric conversion device of Example 5 by more than 10% compared to Comparative Example 1, the refractive index of silicon composite layer 4 should be in a range from 1.8 to 2.

Hereinafter, explanation will be given for cases where the silicon composite layer is used also as a part of one conductivity type layer (p-type layer) in the back photoelectric conversion unit in the two-unit stacked-layer type photoelectric conversion device, in conjunction with Comparative Example 1 of the prior art and Examples 6-9 of the present invention. Relative values of properties of these stacked-layer type photoelectric conversion devices are summarized and listed in Table 2.

TABLE 2

| | Constitution of n-type layer in front photoelectric conversion unit | Constitution of p-type layer in back photoelectric conversion unit | Output properties (normalized with Comp. Ex. 1) | | | |
|---|---|---|---|---|---|---|
| | | | Voc | Jsc | FF | Eff |
| Comp. Ex. 1 | Microcrystalline silicon | Microcrystalline silicon | 1.00 | 1.00 | 1.00 | 1.00 |
| Ex. 6 | Microcrystalline silicon | Silicon composite layer | 1.00 | 1.09 | 0.96 | 1.04 |
| Ex. 7 | Silicon composite layer | Silicon composite layer | 1.00 | 1.20 | 0.93 | 1.11 |
| Ex. 8 | Microcrystalline silicon/Silicon composite layer | Silicon composite layer/ Microcrystalline silicon | 0.99 | 1.17 | 0.97 | 1.12 |
| Ex. 9 | Silicon composite layer/ Microcrystalline silicon | Microcrystalline silicon/Silicon composite layer | 0.99 | 1.14 | 0.98 | 1.12 |

EXAMPLE 6

Figure 21:
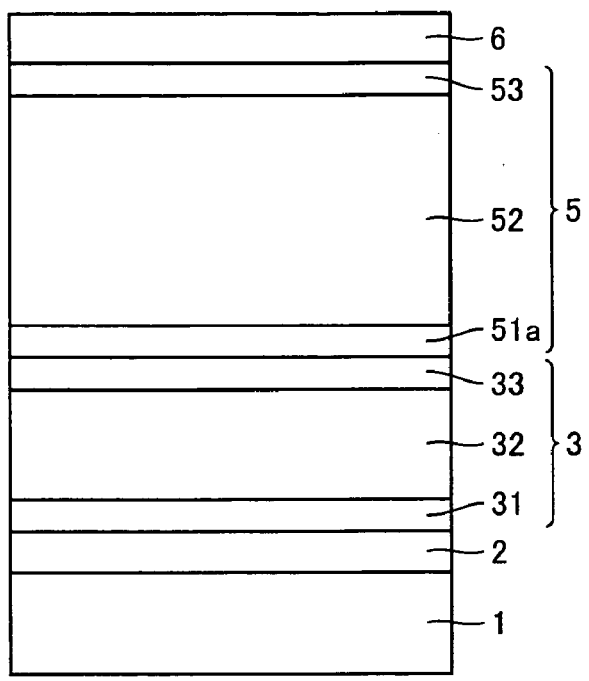
FIG. 21 is a schematic cross sectional view of a stacked-layer type photoelectric conversion device according to yet another embodiment of the present invention.

A stacked-layer type photoelectric conversion device as shown in FIG. 21 was fabricated in Example 6. The device of Example 6 differs from the device of Comparative Example shown in FIG. 15 only in that the p-type layer of back photoelectric conversion unit 5 is replaced with a 30 nm thick p-type silicon composite layer 51a.

P-type silicon composite layer 51a was formed under plasma CVD conditions of a gas flow rate ratio of $SiH_4/CO_2/B_2H_6/H_2=1/2/0.0025/500$ sccm, a power supply frequency of 13.56 MHz, a power density of 100 mW/cm², a pressure of 800 Pa, and a substrate temperature of 200° C. The obtained p-type silicon composition layer 51a had an oxygen concentration of 29 atomic % and a refractive index of 2.45 regarding light of 600 nm wavelength. Then, its intensity ratio of the TO mode peak of crystalline silicon component to the TO mode peak of amorphous silicon component measured by Raman scattering was 1.2 and its dark conductivity was $2 \times 10^{-5}$ S/cm.

As shown in Table 2, Jsc and Eff in Example 6 also are improved as compared to Comparative Example 1. It is considered that p-type silicon composite layer 51a functions as the intermediate reflective layer, effectively reflecting the incident light to the front photoelectric conversion unit 3 side, and that since the p-type layer of back photoelectric conversion unit 5 has been replaced with highly transparent p-type silicon composite layer 51a, the light absorption loss is also decreased. However, it is noted that FF in Example 6 is decreased as compared to Comparative Example 1, presumably because the contact resistance is increased at the interface of n-type microcrystalline silicon layer 33/p-type silicon composite layer 51a or at the interface of p-type silicon composite layer 51a/i-type crystalline silicon layer 52.

EXAMPLE 7

Figure 22:
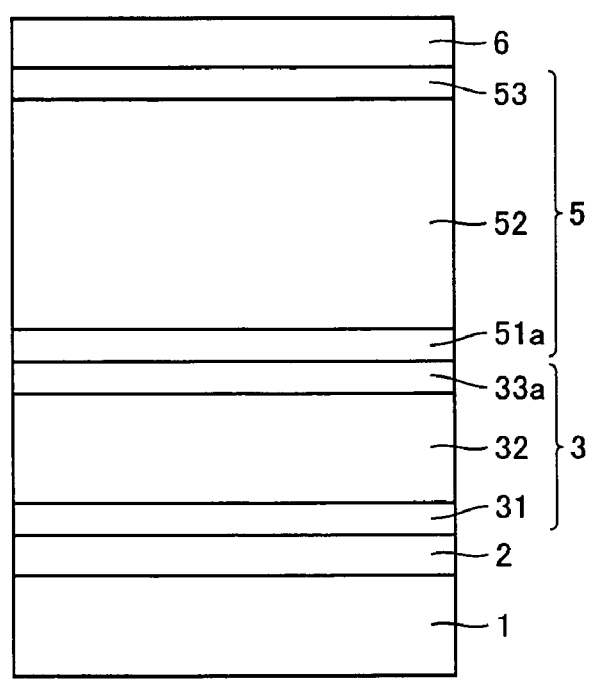
FIG. 22 is a schematic cross sectional view of a stacked-layer type photoelectric conversion device according to yet another embodiment of the present invention.

A stacked-layer type photoelectric conversion device as shown in FIG. 22 was fabricated in Example 7. The device of Example 7 differs from that of Comparative Example 1 shown in FIG. 15 only in that the n-type layer of front photoelectric conversion unit 3 is replaced with a 30 nm thick n-type silicon composite layer 33a, and the p-type layer of back photoelectric conversion unit 5 is replaced with a 30 nm thick p-type silicon composite layer 51a. N-type silicon composite layer 33a is formed under plasma CVD conditions similar to those for n-type silicon composite layer 4 used in Examples 1 and 2.

It is seen from Table 2 that in Example 7 Jsc is considerably increased and Eff is improved as compared to Comparative Example 1, and the Jsc is increased and the Eff is improved even as compared to Example 6, presumably for the following reasons. N-type silicon composite layer 33a and p-type silicon composite layer 51a have a total thickness of 60 nm, and thus their functions as the intermediate reflective layers are further improved. Furthermore, since the n-type layer of front photoelectric conversion unit 3 and the p-type layer of back photoelectric conversion unit 5 are replaced with highly transparent silicon composite layers, the light absorption loss is considerably reduced. However, it is noted that FF in Example 7 is decreased compared to Comparative Example 1, presumably because the contact resistance at the interface of i-type amorphous silicon layer 32/silicon composite layer 33a or at the interface of p-type silicon composite layer 51a/i-type crystalline silicon layer 52 is increased.

EXAMPLE 8

Figure 23:
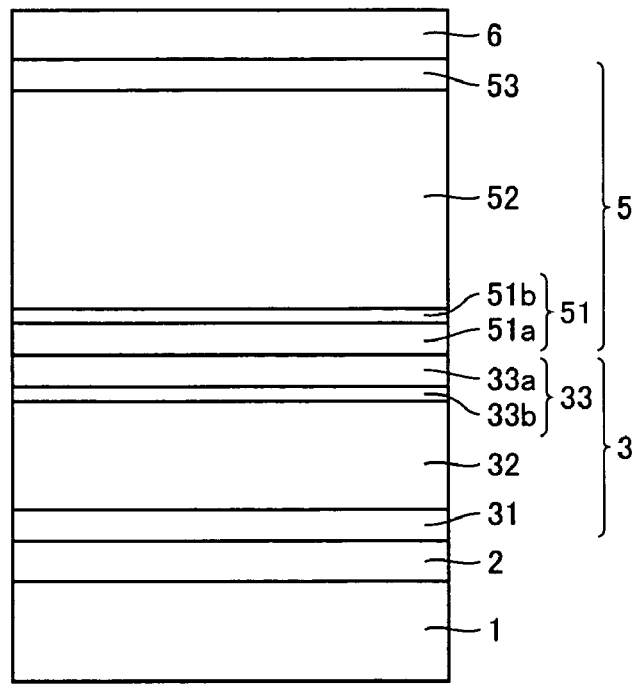
FIG. 23 is a schematic cross sectional view of a stacked-layer type photoelectric conversion device according to yet another embodiment of the present invention.

A stacked-layer type photoelectric conversion device as shown in FIG. 23 was fabricated in Example 8. The device of Example 8 differs from that of Example 7 shown in FIG. 22 only in that a 10 nm thick n-type microcrystalline silicon layer 33b and a 30 nm thick n-type silicon composite layer 33a are stacked in this order as n-type layer 33 of front photoelectric conversion unit 3, and a 30 nm thick p-type silicon composite layer 51a and a 5 nm thick p-type microcrystalline silicon layer 51b are stacked in this order as p-type layer 51 of back photoelectric conversion unit 5.

As shown in Table 2, FF in Example 8 is improved compared to Example 7, presumably because the contact resistance at the interface of i-type amorphous silicon layer 32/n-type silicon composite layer 33a is reduced by insertion of thin n-type microcrystalline silicon layer 33b, and the contact resistance at the interface of p-type silicon composite layer 51a/i-type crystalline silicon layer 52 is reduced by insertion of thin p-type microcrystalline silicon layer 51b. On the other hand, Jsc in Example 8 is slightly decreased compared to Example 7, due to the light absorption loss at n-type microcrystalline silicon layer 33b and p-type microcrystalline silicon layer 51b.

EXAMPLE 9

Figure 24:
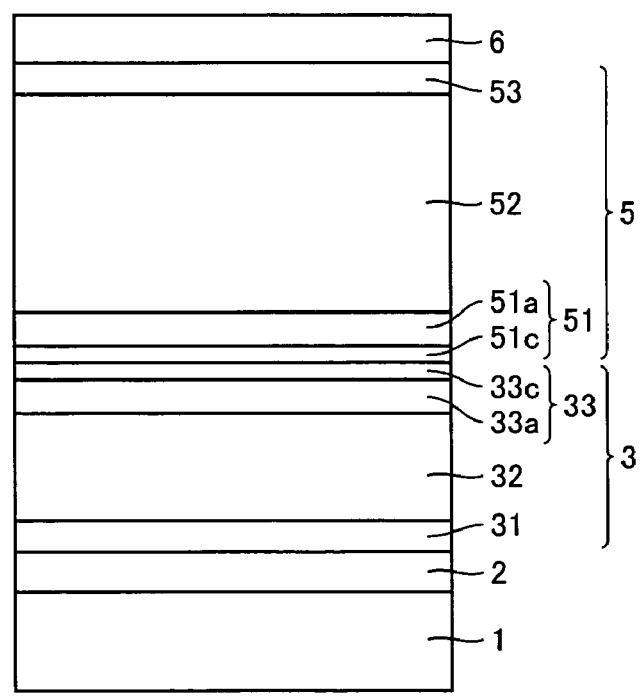
FIG. 24 is a schematic cross sectional view of a stacked-layer type photoelectric conversion device according to yet another embodiment of the present invention.

A stacked-layer type photoelectric conversion device as shown in FIG. 24 was fabricated in Example 9. The device of Example 9 differs from that of Example 8 shown in FIG. 23 only in that a 30 nm thick n-type silicon composite layer 33a and a 10 nm thick n-type microcrystalline silicon layer 33c are stacked in this order as n-type layer 33 of front photoelectric conversion unit 3, and a 5 nm thick p-type microcrystalline silicon layer 51c and a 30 nm thick p-type silicon composite layer 51a are stacked in this order as p-type layer 51 of back photoelectric conversion unit 5.

As shown in Table 2, FF in Example 9 is further improved compared to Example 8, presumably because at the junction interface between front and back photoelectric conversion units 3 and 5 where influence of the contact resistance would be most considerable, a silicon composite layer is not disposed but the junction of n-type microcrystalline silicon layer 33c/p-type microcrystalline silicon layer 51c is formed similarly as in Comparative Example 1 of FIG. 15.

EXAMPLE 10

A stacked-layer type photoelectric conversion device as shown in FIG. 17 was fabricated in Example 10, similarly as in Example 2. The device of Example 10 differs from that of Example 2 only in that the thickness of n-type silicon composite layer 4 of front photoelectric conversion unit 3 is changed to 50 nm, and that the plasma CVD conditions are changed. That is, the remaining conditions of forming the device of Example 10 are similar to those of Comparative Example 1 and Example 2.

More specifically, n-type silicon composite layer 4 of Example 10 was formed under the plasma CVD conditions of the gas flow rate ratio of $SiH_4/CO_2/PH_3/H_2=1/3/0.02/100$, the power supply frequency of 13.56 MHz, the power density of 100 mW/cm$^2$, the pressure of 100 Pa, and the substrate temperature of 200° C. In Example 10, unlike in the case of Comparative Example 2, the dilution of $SiH_4$ with $H_2$ is increased to 100 times, which is the condition where the crystal phase readily appears provided that $CO_2$ is not contained. The n-type silicon composition layer 4 obtained under these conditions had an oxygen concentration of 44 atomic %, an optical gap of 2.42 eV, Exps measured by XPS of 3.6 eV, and a dark conductivity of $1.2\times10^{-12}$ S/cm. Then, its refractive index regarding light of 600 nm wavelength was as low as 1.95, which is approximately comparable to that of the TCO layer. In this silicon composite layer, a TO mode peak of amorphous silicon was detected by Raman scattering measurement, proving that amorphous silicon is included locally, whereas a TO mode peak of crystalline silicon was not detected. That is, the intensity ratio (Ic/Ia) of the TO mode peak derived from the crystalline silicon phase to the TO mode peak derived from the amorphous alloy phase was 0, and no silicon crystal phase was detected. Even with X-ray diffraction and transmission electron microscopy, the crystal phase was not detected in the silicon composite layer of Example 10.

Table 3 shows properties of the stacked-layer type photoelectric conversion devices of Comparative Example 1 and Example 10. As seen from Table 3, even in Example 10 in which the silicon composite layer does not include silicon crystal phase parts, Jsc is increased and Eff is improved compared to Comparative Example 1. The spectral sensitivity currents in both first and second photoelectric conversion units 3 and 5 were also increased in Example 10 compared to Comparative Example 1. This shows that silicon composite layer 4 functions as the intermediate reflective layer, effectively reflecting the incident light to the first photoelectric conversion unit 3 side. Further, it is considered that the light scattering due to silicon composite layer 4 elongates the optical path length within second photoelectric conversion unit 5. Further, the light absorption loss is reduced presumably because the n-type layer of first photoelectric conversion unit 3 has been replaced with highly transparent silicon composite layer 4. However, it is noted that FF in Example 10 is decreased compared to Comparative Example 1, presumably because the contact resistance is increased at the interface of i-type amorphous silicon layer 32/silicon composite layer 4 or at the interface of silicon composite layer 4/p-type microcrystalline silicon layer 51.

TABLE 3

| | Constitution of n-type layer in front photoelectric conversion unit | Output properties (normalized with Comp. Ex. 1) | | | |
|---|---|---|---|---|---|
| | | Voc | Jsc | FF | Eff |
| Comp. Ex. 1 | Microcrystalline silicon | 1.00 | 1.00 | 1.00 | 1.00 |
| Ex. 10 | Silicon composite layer | 0.99 | 1.16 | 0.95 | 1.09 |

EXAMPLE 11

Figure 35:
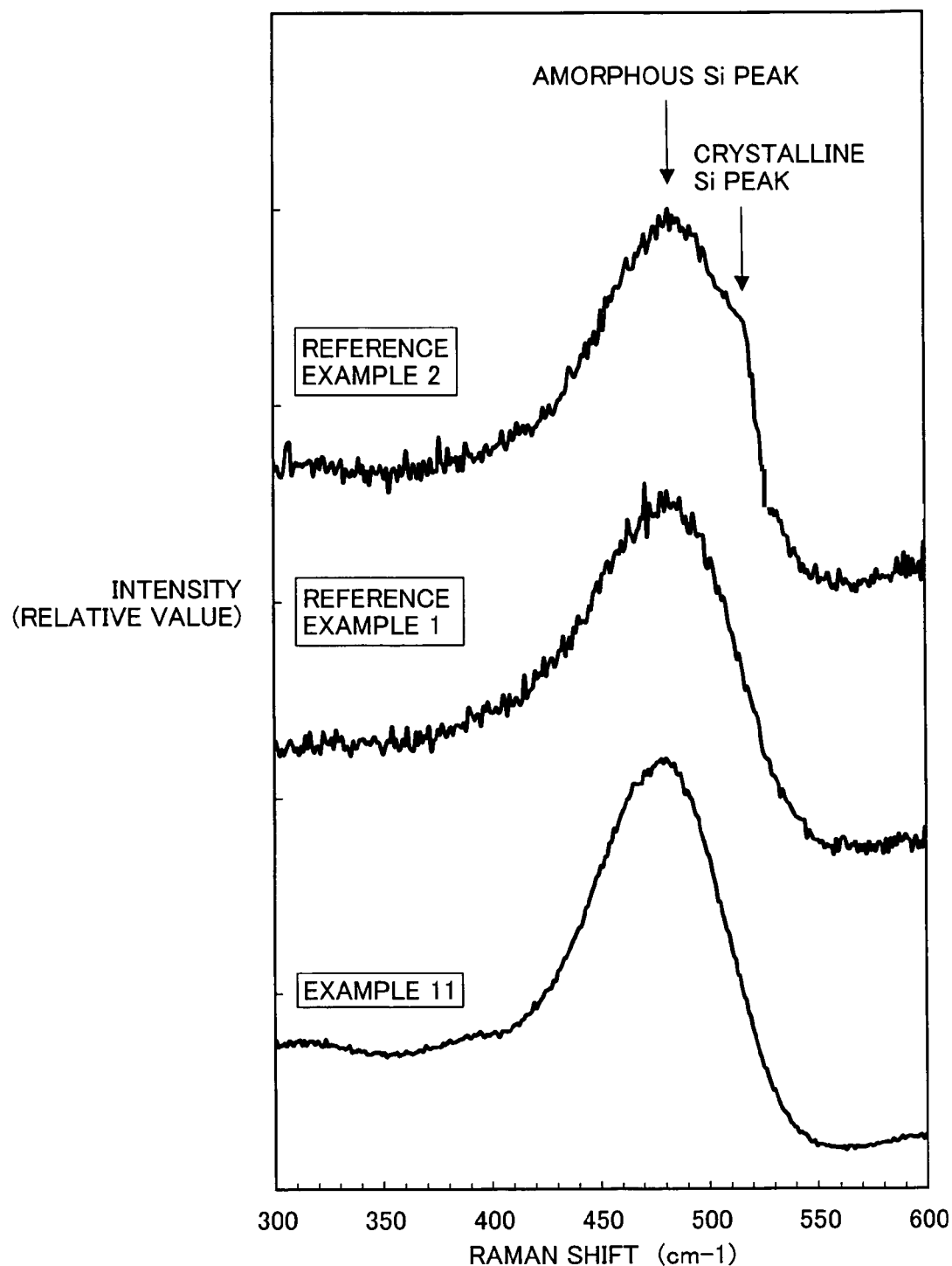
FIG. 35 is a graph showing other examples of Raman scattering spectrums of the silicon composite layers.

The graph of FIG. 35 shows Raman scattering spectra measured while changing the thickness of the silicon composite layer. In this graph, the silicon composite layers of Example 11, Reference Example 1 and Reference Example 2 were formed under the same plasma CVD conditions as those for the silicon composite layer of Example 10. In Example 11, back electrode 6 of the stacked-layer type photoelectric conversion device of Example 10 was removed, and the Raman scattering spectrum was measured while exposing the surface of silicon composite layer 4 by ion sputtering. At this time, silicon composite layer 4 had a thickness of 50 nm. In Reference Examples 1 and 2, 300 mm thick and 1 μm thick silicon composite layers were deposited on glass substrates, respectively.

In each of Example 11 and Reference Example 1 having the silicon composite layers of 50 nm and 300 nm, respectively, only a wide TO mode peak of amorphous silicon component was observed in the vicinity of 480 cm$^{-1}$, as shown in FIG. 35, indicating that each composite layer does not include the crystal phase. In Reference Example 2 having the 1 μm thick silicon composite layer, on the other hand, a shoulder was observed in the vicinity of 520 cm$^{-1}$ in the graph of FIG. 35, and the TO mode peak by crystalline silicon component was detected.

As shown in FIG. 35, the crystal phase is detected when the thickness of the silicon composite layer is increased, and thus it is considered that the silicon composite layer of Example 11 is in a state immediately before generation of the crystal phase. That is, it can be said that under the same plasma CVD conditions, the silicon composite layer in the stacked-layer type photoelectric conversion device is preferably deposited to have a thickness of more than 1 μm to thereby include silicon crystal phase parts. It is noted that in the silicon composite layers of Example 11 and Reference Example 1, the crystal phase was not detected even with X-ray diffraction or transmission electron microscopy.

In the case of depositing the silicon composite layer changing only the hydrogen dilution ratio compared to Example 11, the crystal phase was detected only in the silicon composite layer obtained with the hydrogen dilution ratio of more than 120. Further, in the photoelectric conversion device having the stacked-layer structure of Example 1, when only the hydrogen dilution ratio was changed in a rage of 50 to 120 at the time of deposition of silicon composite layer 4, Jsc was increased by more than 5% compared to Comparative Example 1 with the hydrogen dilution ratio of more than 70. Thus, when the silicon composite layer is deposited for use as the intermediate reflective layer in the stacked-layer type photoelectric conversion device, it can be said that it is one of preferable conditions to set the hydrogen dilution ratio to more than 60% in which case the crystal phase can be detected. Incidentally, when a silicon composite layer was deposited with film deposition conditions other than the hydrogen dilution ratio being shifted from the plasma CVD conditions suitable for generation of the crystal phase to those suitable for generation of the amorphous phase, the formed silicon composite layer was still effective for improving properties of the stacked-layer type photoelectric conversion device.

EXAMPLE 12

Figure 25:
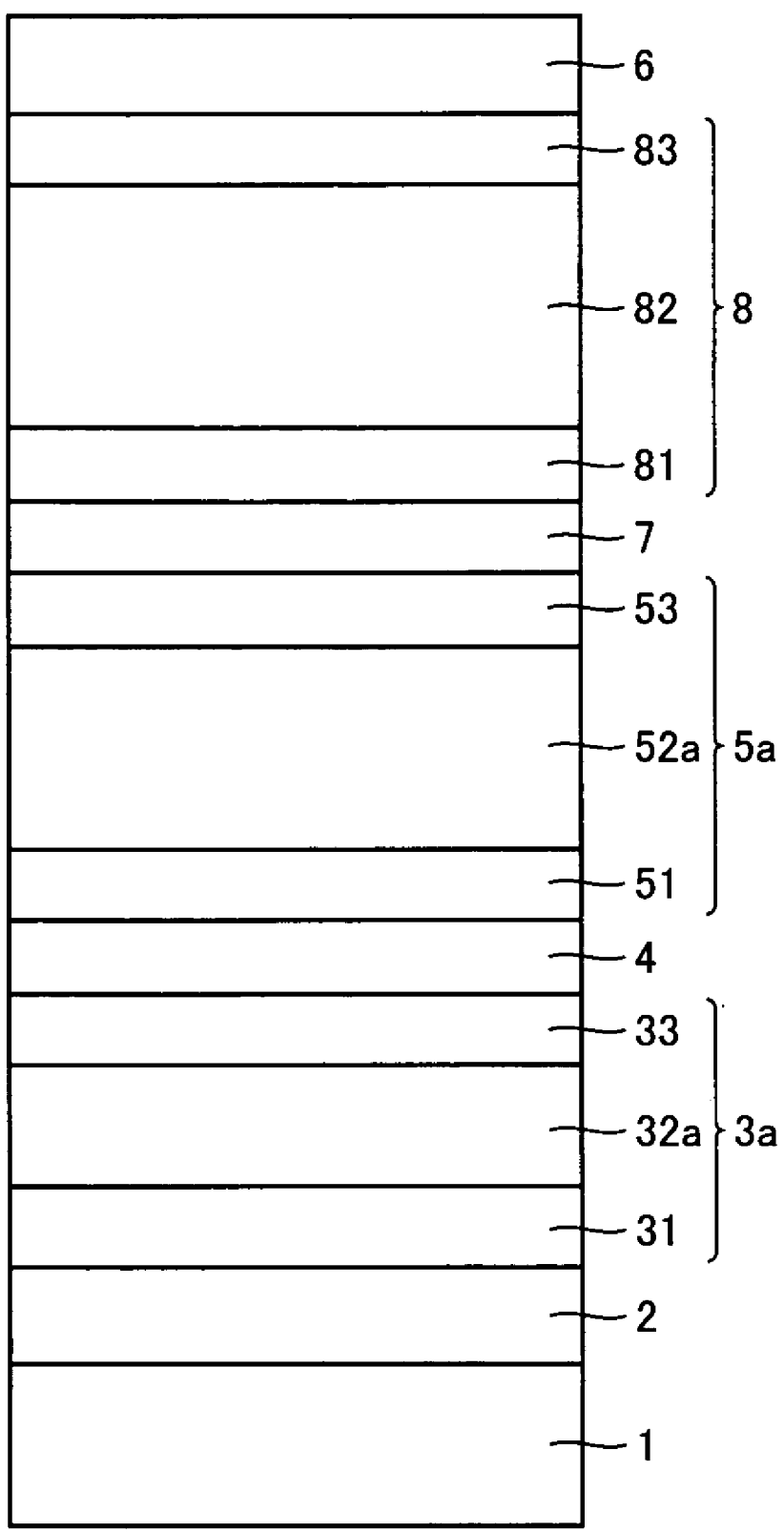
FIG. 25 is a schematic cross sectional view of a three-unit stacked-layer type photoelectric conversion device according to yet another embodiment of the present invention.

FIG. 25 schematically shows a three-unit stacked-layer type photoelectric conversion device of Example 12. This photoelectric conversion device was fabricated in a similar manner as in Example 1 of FIG. 10 up to completion of a second-level photoelectric conversion unit 5a, except that thicknesses of the i-type layers were changed. I-type amorphous silicon layer 32a of a first-level photoelectric conversion unit 3a in FIG. 25 has a thickness of 100 nm, and i-type crystalline silicon layer 52a of second-level photoelectric conversion unit 5a has a thickness of 1.2 μm. A 30 nm thick second silicon composite layer 7 was formed on second-level photoelectric conversion unit 5a, and then a 15 nm thick p-type microcrystalline silicon layer 81, a 2.0 μm thick i-type crystalline silicon layer 82 and a 15 nm thick n-type microcrystalline silicon layer 83 were formed as a third-level photoelectric conversion unit 8. Thereafter, a 90 nm thick Al-doped ZnO layer and a 300 nm thick Ag layer were successively formed as back electrode 6 by sputtering. First silicon composite layer 4 and second silicon composite layer 7 were formed under plasma CVD conditions similar to those for silicon composite layer 4 of Example 1.

For the three-unit stacked-layer type photoelectric conversion device of Example 12 thus obtained, output properties were measured under conditions similar to those for Table 1. As a result, Voc was 1.905 V, Jsc was 10.07 mA/cm$^2$, FF was 0.745, and Eff was 14.29%.

COMPARATIVE EXAMPLE 3

Figure 26:
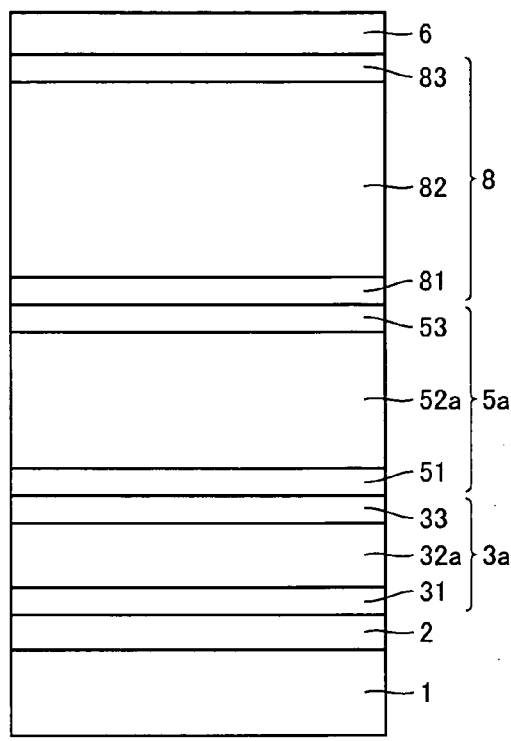
FIG. 26 is a schematic cross sectional view of a conventional three-unit stacked-layer type photoelectric conversion device.

A three-unit stacked-layer type photoelectric conversion device as shown in FIG. 26 was fabricated as Comparative Example 3. The device of Comparative Example 3 differs from that of Example 12 shown in FIG. 25 only in that it does not include first and second silicon composite layers 4 and 7. As a result of measuring output properties of this Comparative Example 3, Voc was 1.910 V, Jsc was 9.50 mA/cm$^2$, FF was 0.749, and Eff was 13.59%.

Comparing Example 12 and Comparative Example 3, it is found that in the three-unit staked-layer type photoelectric conversion device as well, Jsc is increased by the reflection effect of the silicon composite layer, and Eff is improved.

Hereinafter, in connection with the three-unit stacked-layer type photoelectric conversion device, explanation will further given for Comparative Example 4 of the prior art and Examples 13 and 14 of the present invention. Properties of these stacked-layer type photoelectric conversion devices are summarized and listed with relative values in Table 4.

TABLE 4

| | Silicon composite layer between first and second photoelectric conversion units | Silicon composite layer between second and third photoelectric conversion units | Output properties (normalized with Comp. Ex. 3) | | | |
|---|---|---|---|---|---|---|
| | | | Voc | Jsc | FF | Eff |
| Comp. Ex. 4 | None | None | 1.00 | 1.00 | 1.00 | 1.00 |
| Ex. 13 | None | Present | 1.00 | 1.06 | 0.99 | 1.04 |
| Ex. 14 | Present | Present | 1.00 | 1.06 | 1.00 | 1.05 |

COMPARATIVE EXAMPLE 4

A three-unit stacked-layer type photoelectric conversion device of Comparative Example 4 differs from that of Comparative Example 3 shown in FIG. 26 only in that the thickness of i-type crystalline silicon layer 82 in third-level photoelectric conversion unit 8 is changed from 2.0 μm to 2.5 μm.

EXAMPLE 13

Figure 27:
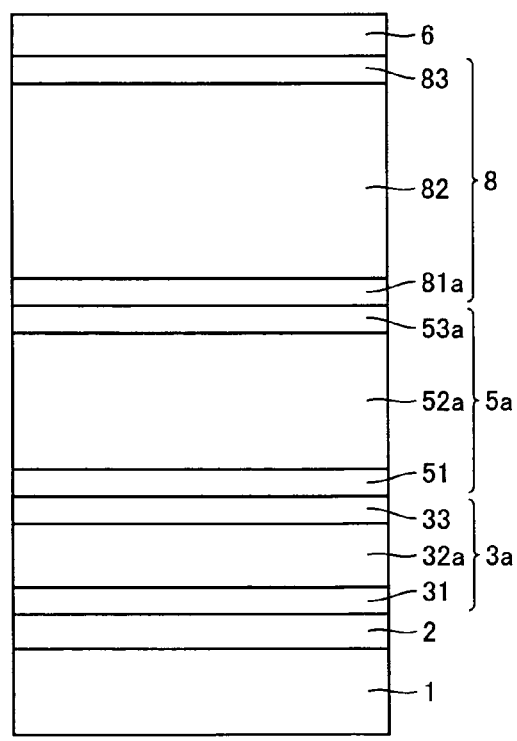
FIG. 27 is a schematic cross sectional view of a three-unit stacked-layer type photoelectric conversion device according to yet another embodiment of the present invention.

A three-unit stacked-layer type photoelectric conversion device as shown in FIG. 27 was fabricated in Example 13. The device of FIG. 27 differs from that of Comparative Example 4 only in that the n-type layer of second photoelectric conversion unit 5a is replaced with an n-type silicon composite layer 53a, and the p-type layer of third photoelectric conversion unit 8 is replaced with a p-type silicon composite layer 81a. N-type silicon composite layer 53a was deposited under conditions similar to those for the n-type silicon composite layer used in Example 1, and p-type silicon composite layer 81a was deposited under conditions similar to those for the p-type silicon composite layer used in Example 6.

As shown in Table 4, in the three-unit stacked-layer type photoelectric conversion device of Example 13 also, Jsc is increased and Eff is improved compared to Comparative Example 4, by virtue of the reflection effect of the intermediate silicon composite layers.

EXAMPLE 14

Figure 28:
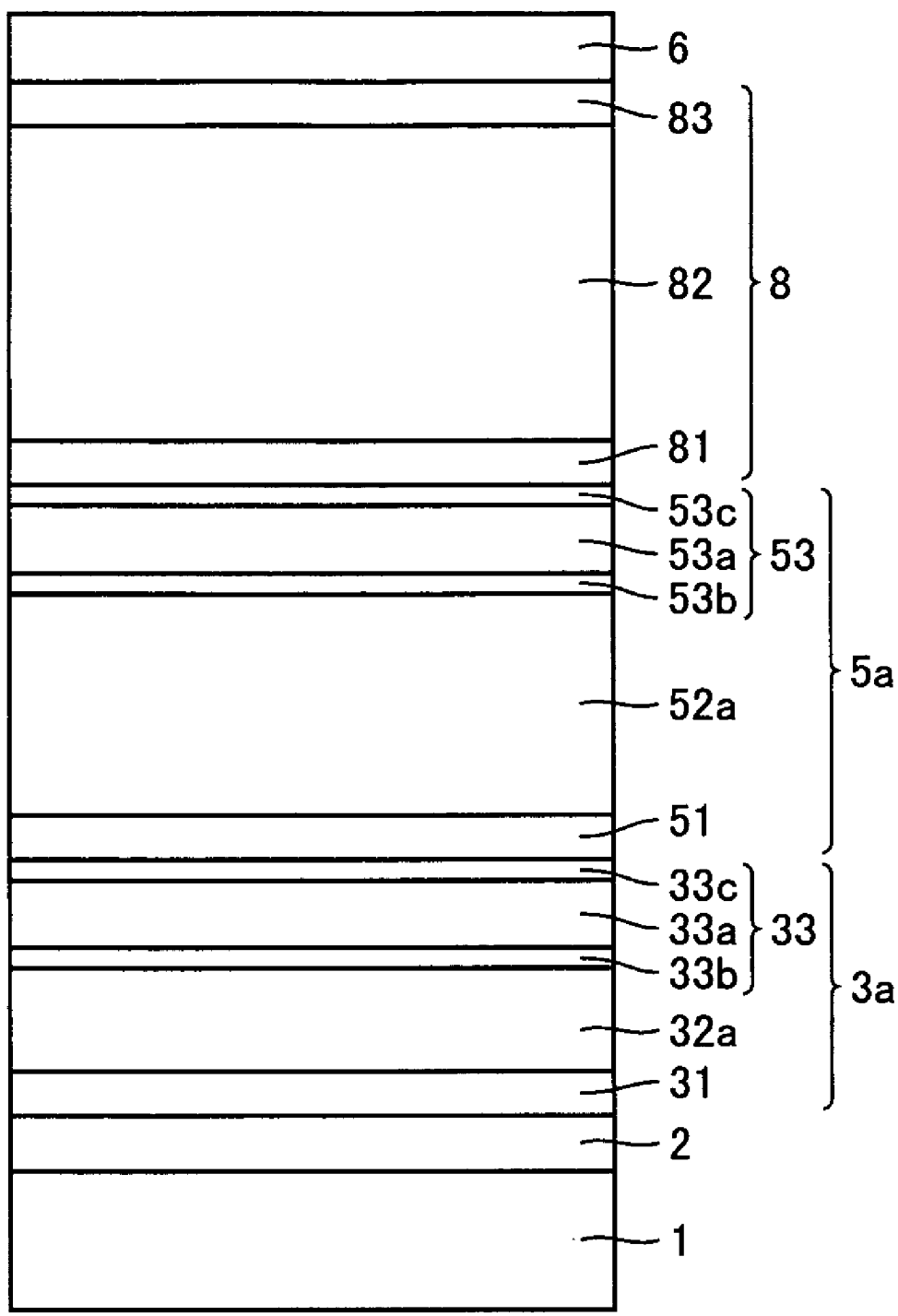
FIG. 28 is a schematic cross sectional view of a three-unit stacked-layer type photoelectric conversion device according to yet another embodiment of the present invention.

A three-unit stacked-layer type photoelectric conversion device as shown in FIG. 28 was fabricated in Example 14. The device of Example 14 differs from that of Comparative Example 4 in that a 5 nm thick n-type microcrystalline silicon layer 33b, a 50 nm thick n-type silicon composite layer 33a, and 5 nm thick n-type microcrystalline silicon layer 33c are stacked in this order as n-type layer 33 of a first-level photoelectric conversion unit 3a, and a 5 nm thick n-type microcrystalline silicon layer 53b, a 50 nm thick n-type silicon composite layer 53a, and a 5 nm thick n-type microcrystalline silicon layer 53c are stacked in this order as n-type layer 53 of a second-level photoelectric conversion unit 5a. N-type silicon composite layer 33a and n-type silicon composite layer 53a were deposited under conditions similar to those for n-type silicon composite layer 4 of Example 10.

As shown in Table 4, in the three-unit stacked-layer type photoelectric conversion device of Example 14 also, Jsc is increased and Eff is improved compared to Comparative Example 4, by virtue of the reflection effect of the intermediate silicon composite layers.

EXAMPLE 15

Figure 29:
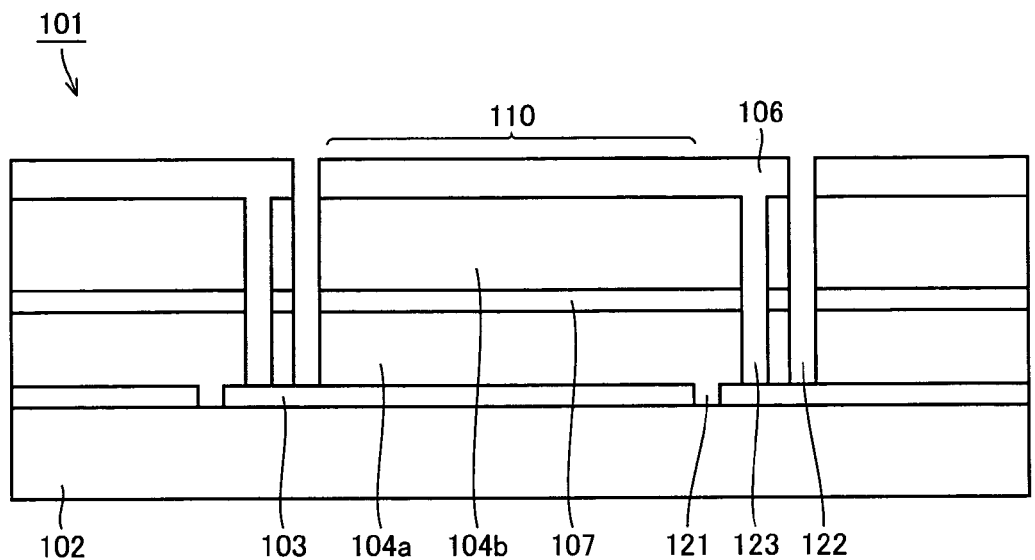
FIG. 29 is a schematic cross sectional view of an integrated type photoelectric conversion module according to yet another embodiment of the present invention.

FIG. 29 shows an integrated type thin-film photoelectric conversion module according to Example 15 of the present invention. The module of FIG. 29 differs from the conventional module of FIG. 31 only in that ZnO intermediate reflective layer 105 is replaced with a silicon composite layer 107. Thicknesses and forming methods of the layers included in the module of Example 15 are similar to those of Example 1. The module of FIG. 29 has an area of 910 mm×455 mm, and 100 photoelectric conversion cells partitioned by patterning are connected in series with each other.

COMPARATIVE EXAMPLES 5-7

Figure 30:
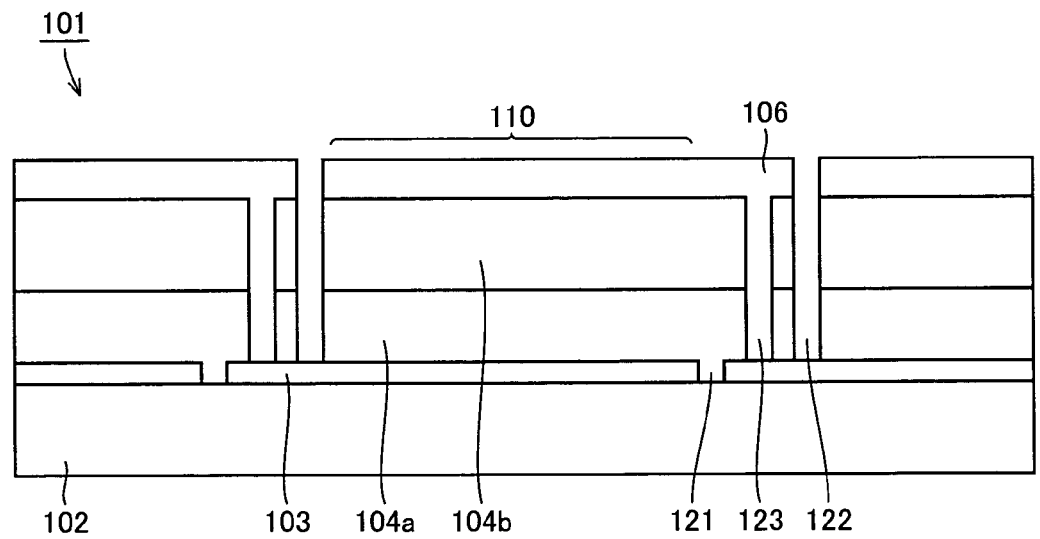
FIG. 30 is a schematic cross sectional view of an example of a conventional integrated type photoelectric conversion module.
Figure 31:
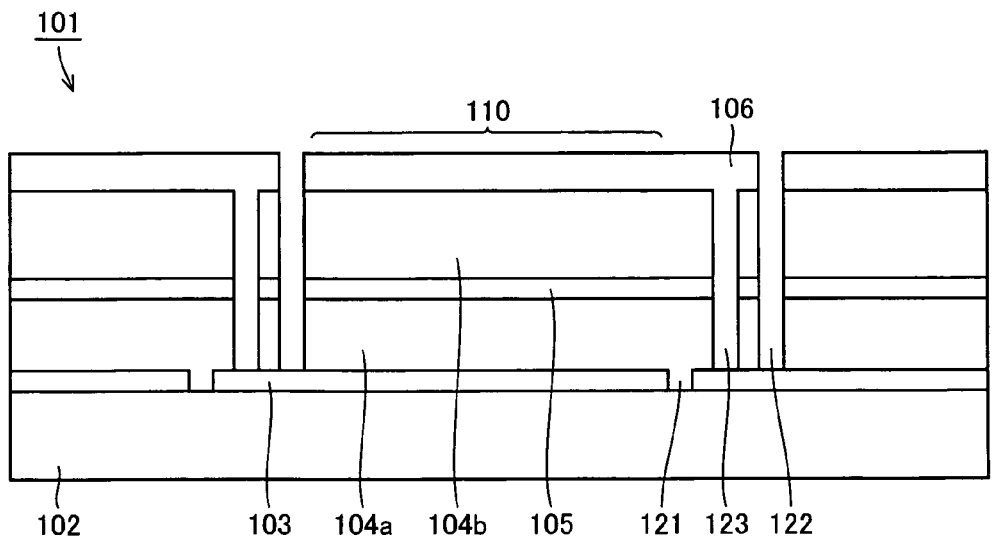
FIG. 31 is a schematic cross sectional view of another example of a conventional integrated type photoelectric conversion module.

An integrated type thin-film photoelectric conversion module including no intermediate reflective layer as shown in FIG. 30 was fabricated as Comparative Example 5. A module as shown in FIG. 31, including a 30 nm thick ZnO intermediate reflective layer 105 formed by sputtering, was fabricated as Comparative Example 6. A module as shown in FIG. 32, including a ZnO intermediate reflective layer 105 and a third isolation groove 124, was fabricated as Comparative Example 7.

Table 5 shows output properties of the integrated type thin-film photoelectric conversion modules of Example 15 and Comparative Examples 5-7, measured under conditions similar to those for Table 1.

TABLE 5

| | Structure | Third isolation groove | Intermediate reflective layer | Voc (V) | Jsc (A) | FF | Pmax (W) | Eff (%) |
|---|---|---|---|---|---|---|---|---|
| Ex. 15 | FIG. 29 | None | Silicon composite layer | 132.3 | 0.536 | 0.712 | 50.5 | 13.2 |
| Comp. Ex. 5 | FIG. 30 | None | None | 132.9 | 0.420 | 0.729 | 40.7 | 10.6 |
| Comp. Ex. 6 | FIG. 31 | None | ZnO | 108.3 | 0.506 | 0.524 | 28.7 | 7.5 |
| Comp. Ex. 7 | FIG. 32 | Present | ZnO | 136.5 | 0.464 | 0.694 | 43.9 | 11.5 |

As seen from Table 5, in Comparative Example 6 including the ZnO intermediate reflective layer, Voc and FF are noticeably lowered, and the maximum power (Pmax) and the conversion efficiency (Eff) are considerably decreased, as compared to Comparative Example 5 including no intermediate reflective layer. This is because leakage current flows through the current path of ZnO intermediate reflective layer 105, connection groove 123 and back electrode layer 106. In Comparative Example 7 including third isolation groove 124, on the other hand, such leakage current is suppressed, and thus the shorted-circuit current (Jsc) increases and Pmax is improved by about 3 W, as compared to Comparative Example 5.

In Example 15 including silicon composite layer 107, Jsc further increases compared to Comparative Example 7, and Pmax is improved by about 10 W compared to Comparative Example 5, presumably because the area loss due to third isolation groove 124 is eliminated and then Jsc is improved. Further, in Example 15, front photoelectric conversion unit layer 104*a*, silicon composite layer 107 and back photoelectric conversion unit layer 104*b* can be formed continuously by plasma CVD. This prevents atmospheric contamination of the interface between silicon composite layer 107 and back photoelectric conversion unit 104*b*, leading to improvement of FF.

Further, in Example 15, third isolation groove 124 is not needed. This decreases the number of times of patterning, and thus the production costs and time can be reduced compared to Comparative Example 7. Silicon composite layer 107 can be formed by only adding a gas line for $CO_2$ in the plasma CVD apparatus for forming the photoelectric conversion unit. Other film formation equipment such as a sputtering apparatus, otherwise required for forming the ZnO intermediate layer, becomes unnecessary, so that the production costs can be reduced considerably. Still further, the number of times of process steps of introducing the substrate into the vacuum plasma CVD apparatus, heating the substrate therein, and taking the substrate out from the plasma CVD apparatus are decreased by 1 each in Example 15 as compared to Comparative Example 7, which further reduces the production costs and time.

EXAMPLE 16

Two-unit stacked-layer type photoelectric devices each having such a stacked-layer structure as shown in FIG. 17 were fabricated in Example 16, similarly as in Example 2. In Example 16, however, photoelectric conversion devices as Samples 1A and 1B were fabricated through processes slightly different from each other.

For Sample 1A, firstly, a transparent electrode layer including $SnO_2$ as its main component was formed on transparent glass substrate 1. The substrate was then introduced into a first plasma CVD apparatus, and its temperature was raised. Thereafter, p-type amorphous silicon carbide layer 31, i-type amorphous silicon photoelectric conversion layer 32, and a first part of n-type silicon composite layer 4 of amorphous silicon photoelectric conversion unit 3 were formed to thicknesses of 15 nm, 300 nm and 40 nm, respectively.

The first part of n-type silicon composite layer 4 was formed under conditions of a gas flow rate ratio of $SiH_4/CO_2/PH_3/H_2=1/3/0.025/200$, a power supply frequency of 13.56 MHz, a power density of 120 mW/cm$^2$, and a substrate temperature of 180° C. The first part of n-type silicon composite layer 4 thus formed had an oxygen concentration of 42 atomic %, and a refractive index of 2.0 regarding light of 600 nm wavelength.

After deposition of the first part of n-type silicon composite layer 4, followed by evacuation of the film deposition chamber, the substrate was immediately transferred to an unload chamber of the first plasma CVD apparatus. Then, after chamber was quickly filled with nitrogen gas, the substrate was taken out to the ambient air.

After the substrate was left in (or exposed to) the ambient air for about 40 hours, it was introduced into a second plasma CVD apparatus and then its temperature was raised. A second part of n-type silicon composite layer 4 was then formed to a thickness of 10 nm. The second part of n-type silicon composite layer 4 had a refractive index and an oxygen concentration similar to those of the first part of silicon composite layer 4 formed in the first plasma CVD apparatus.

Subsequently, p-type microcrystalline silicon layer 51, non-doped i-type crystalline silicon photoelectric conversion layer 52, and n-type microcrystalline silicon layer 53 were formed in the same second plasma CVD apparatus to thicknesses of 15 nm, 2.5 µm and 15 nm, respectively. Thereafter, a 90 nm thick Al-doped ZnO layer and a 300 nm thick Ag layer were successively deposited as back electrode 6 by sputtering.

The stacked-layer type photoelectric conversion device of Sample 1B differs from the device of Sample 1A only in that amorphous silicon photoelectric conversion unit 3 through crystalline silicon photoelectric conversion unit 5 were formed continuously in the same plasma CVD apparatus. That is, in the device of Sample 1B, the entire thickness of n-type silicon composite layer 4 was deposited continuously in the same plasma CVD apparatus, without taking the substrate out to the ambient air during the deposition.

Photoelectric conversion properties of the photoelectric conversion devices of Samples 1A and 1B were measured under conditions similar to those for Table 1. The conversion efficiency of the photoelectric conversion device of Sample 1A was 1.01 in relative value with respect to Sample 1B, which is high enough despite the exposure to the ambient air.

EXAMPLE 17

Photoelectric conversion devices each having such a stacked-layer structure as shown in FIG. 10 were fabricated in Example 17, similarly as in Example 1. In Example 17, photoelectric conversion devices as Samples 2A and 2B were formed through processes slightly different from each other.

The fabricating process of the photoelectric conversion device of Sample 2A is similar to that of Sample 1A. In the first plasma CVD apparatus, p-type amorphous silicon carbide layer 31, i-type amorphous silicon photoelectric conversion layer 32, n-type microcrystalline silicon layer 33, and a first part of n-type silicon composite layer 4 were formed to thicknesses of 15 nm, 300 nm, 10 nm, and 40 nm, respectively. That is, Sample 2A differs from Sample 1A only in that formation of n-type silicon composite layer 4 follows formation of n-type microcrystalline silicon layer 33 having high conductivity and high crystallinity compared to the silicon composite layer. In Sample 2A, n-type microcrystalline silicon layer 33 formed in advance can reduce the contact resistance at the interface between i-type amorphous silicon layer 32 and silicon composite layer 4, and thus the photoelectric conversion properties are further improved as compared to Sample 1A.

The stacked-layer type photoelectric conversion device of Sample 2B differs from the device of Sample 2A only in that the entire thickness of n-type silicon composite layer 4 is deposited continuously in a single plasma CVD apparatus, without taking the substrate out to the ambient air during the deposition.

Photoelectric conversion properties of the photoelectric conversion devices of Samples 2A and 2B were measured under conditions similar to those for Table 1. The conversion efficiency of the photoelectric conversion device of Sample 2A compared to Sample 2B was 1.01 in relative value, which is high enough despite the exposure to the ambient air.

EXAMPLE 18

In Example 18, additional samples were fabricated by variously changing the refractive index regarding light of 600 nm wavelength and the oxygen concentration of silicon composite layer 4 of Example 17. Table 6 shows photoelectric conversion efficiencies of the samples exposed or unexposed to the ambient air after deposition of up to the first part in thickness of silicon composite layer 4, in relative values with respect to Sample 2B.

TABLE 6

| Oxygen concentration in the film (atomic %) | Refractive index | Photoelectric conversion efficiency (relative value) | | | |
|---|---|---|---|---|---|
| | | Exposed to the ambient air | | Unexposed to the ambient air | |
| 0 | 4.0 | Comparative Sample 01A | 0.83 | Comparative Sample 01B | 0.87 |
| 19 | 2.8 | Comparative Sample 02A | 0.92 | Comparative Sample 02B | 0.95 |
| 25 | 2.5 | Sample 3A | 0.97 | Sample 3B | 0.97 |
| 33 | 2.2 | Sample 4A | 0.99 | Sample 4B | 0.99 |
| 42 | 2.0 | Sample 2A | 1.01 | Sample 2B | 1.00 |
| 51 | 1.8 | Sample 5A | 1.04 | Sample 5B | 1.03 |

It is found from Table 6 that, as the oxygen concentration of silicon composite layer 4 increases and the refractive index decreases, the effect as the intermediate reflective layer increases and the photoelectric conversion efficiency is improved. In comparison between the sample exposed to the ambient air and the other sample unexposed to the ambient air both having the same oxygen concentration and the same refractive index of silicon composite layer 4, Samples 2A, 3A, 4A, 5A exposed to the ambient air each having the oxygen concentration of more than 25% or the refractive index of less than 2.5 exhibit their photoelectric conversion efficiencies equal to or superior to those of Samples 2B, 3B, 4B, 5B unexposed to the ambient air. The silicon composite layer originally contains oxygen and thus is less likely to suffer an adverse effect of increase in resistance due to surface oxidation or the like. Therefore, higher oxygen concentration and lower refractive index of the silicon composite layer can reduce the influence of the exposure to the ambient air upon the photoelectric conversion properties.

EXAMPLE 19

Additional samples similar to Sample 2A of Example 17 were fabricated in Example 19. Specifically, in Example 19, the ratio between the first and second parts in the total thickness of silicon composite layer 4 was changed variously. Table 7 shows photoelectric conversion efficiencies of the samples exposed to the ambient air after deposition of up to the first part in thickness of silicon composite layer 4, in relative values with respect to Comparative Sample 02B unexposed to the ambient air.

TABLE 7

| | Thickness of silicon composite layer (nm) 33a/33b | Photoelectric conversion efficiency (relative value) |
|---|---|---|
| Comparative Sample 02B | (Unexposed to the ambient air) | 1.00 |
| Comparative Sample 03A | 0/50 | 0.97 |
| Sample 6A | 10/40 | 1.00 |
| Sample 7A | 20/30 | 1.00 |
| Sample 8A | 30/20 | 1.02 |
| Sample 2A | 40/10 | 1.01 |
| Comparative Sample 04A | 50/0 | 0.81 |

As shown in Table 7, in Comparative Sample 03A, the thickness of silicon composite layer 4 before exposure to ambient air is 0, indicating that the sample is exposed to the ambient air between formation of n-type microcrystalline silicon layer 33 and formation of n-type silicon composite layer 4 in FIG. 10. Under the influence of the exposure to the ambient air of the surface of n-type microcrystalline silicon layer 33 originally containing almost no oxygen, the photoelectric conversion efficiency of Comparative Sample 03A is slightly decreased as compared to Comparative Sample 2B. In Comparative Example 04A, deposition thickness of silicon composite layer 4 after exposure to the ambient air is 0, indicating that the structure is exposed to the ambient air between formation of n-type silicon composite layer 4 and p-type microcrystalline silicon layer 51 in FIG. 10. Since the n-p junction interface or the tunnel junction interface between the photoelectric conversion units is exposed to the ambient air, the photoelectric conversion efficiency of Comparative Example 04A is considerably decreased as compared to Comparative Sample 02B.

In each of Samples 6A, 7A, 8A and 2A, on the other hand, parts in thickness of the n-type silicon composite layer are formed immediately before and immediately after the exposure to the ambient air, which makes it possible to obtain the photoelectric conversion efficiency equal to or superior to that of Comparative Sample 02B unexposed to the ambient air. Particularly, in each of Samples 8A and 2A, the first part of 60% or more of the total thickness of n-type silicon composite layer 4 is formed before the exposure to the ambient air, which makes it possible to obtain the photoelectric conversion efficiency superior to that of Comparative Sample 02B. This is presumably because excessive dopant atoms within silicon composite layer 4 and the conductivity type layers are removed during evacuation of the film deposition chamber and re-heating of the substrate which are carried out before film deposition in the second plasma CVD apparatus into which the substrate has been introduced after the exposure to the ambient air. Such an effect is more considerable when the first part of the silicon composite layer formed before the exposure to the ambient air constitutes 60% or more of the total thickness, resulting in improvement of the photoelectric conversion efficiency.

EXAMPLE 20

Photoelectric conversion devices each having such a stacked-layer structure as shown in FIG. 10 were fabricated in Example 20, similarly as in Example 1. In Example 20, various samples of photoelectric conversion devices were fabricated by changing the gas mixture ratios during plasma CVD of silicon composite layer 4.

In Sample 9, firstly, transparent electrode layer 2 including $SnO_2$ as its main component was formed on transparent glass substrate 1. Thereafter, the substrate was introduced into a plasma CVD apparatus and its temperature was raised to deposit p-type amorphous silicon carbide layer 31, i-type amorphous silicon photoelectric conversion layer 32, and n-type microcrystalline silicon layer 33 of amorphous silicon photoelectric conversion unit 3, and then n-type silicon composite layer 4 to thicknesses of 15 nm, 300 nm, 10 nm and 50 nm, respectively.

N-type silicon composite layer 4 was formed under plasma CVD conditions of a gas flow rate ratio of $SiH_4/CO_2/PH_3/H_2 = 1/5/0.025/360$, a power supply frequency of 13.56 MHz, a power density of 150 mW/cm², and a substrate temperature of 180° C. An n-type silicon composite layer formed to a thickness of 300 nm on a glass substrate under the same conditions had a refractive index of 1.83 regarding light of 600 nm wavelength, a phosphorus concentration of $6.0 \times 10^{20}$ cm$^{-3}$ measured by secondary ion mass spectrometry (SIMS), and an oxygen concentration of 52 atomic %. Then, it had an intensity ratio (Ic/Ia) of 2.5 of the TO mode peak derived from the crystalline silicon phase to the TO mode peak derived from the amorphous alloy phase in Raman scattering spectrum.

Next, in the plasma CVD apparatus, p-type microcrystalline silicon layer 51, non-doped i-type crystalline silicon photoelectric conversion layer 52, and n-type microcrystalline silicon layer 53 of crystalline silicon photoelectric conversion unit 5 were formed to thicknesses of 15 nm, 2.5 μm and 15 nm, respectively. Thereafter, a 90 nm thick Al-doped ZnO layer and a 300 nm thick Ag layer were successively formed as back electrode 5 by sputtering.

Samples 10-12 and Comparative Samples 05-07 differ from Sample 9 only in that the mixing ratio of the doping source gas $PH_3$ to the silicon source gas $SiH_4$ in plasma CVD is changed variously for n-type silicon composite layer 4 included therein.

Table 8 shows, for Samples 9-12 and Comparative Samples 05-07, the gas mixture ratio for deposition of silicon composite layer 4, the refractive index regarding light of 600 nm wavelength, the phosphorus concentration, the oxygen concentration, and the peak intensity ratio (Ic/Ia) in Raman scattering spectrum, together with the photoelectric conversion efficiency in relative value with respect to Sample 9.

As seen from Comparative Sample 05 in Table 8, when the silicon composite layer has a low phosphorus concentration, the refractive index is low, while Ic/Ia is low, causing a high resistivity of the silicon composite layer. Then, the photoelectric conversion efficiency is decreased due to increase of the series resistance in the stacked-layer type photoelectric conversion device. On the other hand, it is considered that the phosphorus atoms have the effect of promoting growth of the silicon crystal phase. Thus, when the phosphorus concentration is increased as in Samples 9-12, conductivity of the silicon composite layer is considerably improved with the synergic effect of increase of Ic/Ia and increase of dopant concentration. If the mixture ratio of $PH_3$ and thus the phosphorus concentration are too high as in Comparative Samples 06-07, however, although the conductivity is high because of the silicon crystal phase, the excessive phosphorus atoms are undesirably introduced to the crystalline silicon photoelectric conversion unit 5 side, resulting in degradation of the photoelectric conversion properties. As such, it is found from the results of Samples 9-12 exhibiting high photoelectric conversion efficiencies of 0.95 ore more in relative values, that the preferable phosphorus concentration is in the range from $3 \times 10^{20}$ cm$^{-3}$ to $1.8 \times 10^{21}$ cm$^{-3}$, and the preferable $PH_3/SiH_4$ gas mixture ratio is in the range of 0.012 to 0.07.

Samples 13-15 and Comparative Samples 08-09 additionally fabricated differ from Sample 9 only in that the mixing ratio of the oxygen source gas $CO_2$ to the silicon source gas $SiH_4$ in plasma CVD is changed variously in a range from 2 to 7 for n-type silicon composite layer 4 included therein.

Table 9 shows, for Samples 9, 13-15 and Comparative Samples 08-09, the gas mixture ratio for deposition of silicon composite layer 4, the refractive index regarding light of 600 nm wavelength, the phosphorus concentration, the oxygen concentration, and the peak intensity ratio (Ic/Ia) in Raman scattering spectrum, together with the photoelectric conversion efficiency in relative value with respect to Sample 9.

TABLE 8

| | Gas mixture ratio $SiH_4/CO_2/PH_3/H_2$ | Refractive index | Phosphorus concentration (cm³) | Oxygen concentration (%) | Ic/Ia | Conversion efficiency (relative value) |
|---|---|---|---|---|---|---|
| Comparative Sample 05 | 1/5/0.01/360 | 1.76 | $2.4 \times 10^{20}$ | 54 | 0.9 | 0.81 |
| Sample 10 | 1/5/0.012/360 | 1.79 | $3.1 \times 10^{20}$ | 53 | 1.5 | 0.95 |
| Sample 9 | 1/5/0.025/360 | 1.83 | $6.0 \times 10^{20}$ | 52 | 2.5 | 1.00 |
| Sample 11 | 1/5/0.05/360 | 1.86 | $1.1 \times 10^{21}$ | 52 | 3.0 | 0.97 |
| Sample 12 | 1/5/0.07/360 | 1.88 | $1.8 \times 10^{21}$ | 51 | 3.3 | 0.95 |
| Comparative Sample 06 | 1/5/0.08/360 | 1.9 | $2.0 \times 10^{21}$ | 50 | 3.6 | 0.91 |
| Comparative Sample 07 | 1/5/0.1/360 | 1.95 | $2.5 \times 10^{21}$ | 48 | 4.0 | 0.89 |

TABLE 9

| | Gas mixture ratio $SiH_4/CO_2/PH_3/H_2$ | Refractive index | Phosphorus concentration $(cm^3)$ | Oxygen concentration (%) | Ic/Ia | Conversion efficiency (relative value) |
|---|---|---|---|---|---|---|
| Comparative Sample 08 | 1/2/0.025/360 | 2.35 | $1.2 \times 10^{21}$ | 31 | 4.3 | 0.92 |
| Sample 13 | 1/3/0.025/360 | 2.0 | $9.1 \times 10^{20}$ | 42 | 3.8 | 0.95 |
| Sample 14 | 1/4/0.025/360 | 1.92 | $7.9 \times 10^{20}$ | 49 | 3.1 | 0.99 |
| Sample 9 | 1/5/0.025/360 | 1.83 | $6.0 \times 10^{20}$ | 52 | 2.5 | 1.00 |
| Sample 15 | 1/6/0.025/360 | 1.76 | $5.1 \times 10^{20}$ | 56 | 1.5 | 0.95 |
| Comparative Sample 09 | 1/7/0.025/360 | 1.71 | $4.3 \times 10^{20}$ | 59 | 0.7 | 0.82 |

When the silicon composite layer has a low oxygen concentration and a high refractive index as in Comparative Sample 08 in Table 9, its conductivity is high. However, the reflection effect is weak and the absorption loss increases, so that it is not possible to achieve a good conversion efficiency in the stacked-layer type photoelectric conversion device. In Comparative Sample 09, the oxygen concentration in the silicon composite layer is high and the refractive index is low, while Ic/Ia is low and thus the proportion of the silicon crystal phase is extremely small, causing increase in resistivity of the silicon composite layer. The photoelectric conversion efficiency is low due to the increase in series resistance of the stacked-layer type photoelectric conversion device. Accordingly, it is found from the results of Samples 9 and 13-15 exhibiting high efficiencies of 0.95 or more in relative values, that the refractive index of the silicon composite layer is preferably 2.0 or less, the oxygen concentration is preferably 40% or more, and the peak intensity ratio Ic/Ia in Raman scattering spectrum is preferably 1.5 or more.

INDUSTRIAL APPLICABILITY

As described above, according to the present invention, it is possible to improve the photoelectric conversion efficiency and reduce the production costs of the stacked-layer type thin-film photoelectric conversion device and the integrated type thin-film photoelectric conversion module.

The invention claimed is:

1. A stacked-layer type photoelectric conversion device comprising a plurality of photoelectric conversion units stacked on a substrate, each of which includes a one conductivity-type layer, a photoelectric conversion layer of substantially intrinsic semiconductor, and an opposite conductivity-type layer in this order from a light incident side, wherein
at least one of said opposite conductivity-type layer in a front photoelectric conversion unit arranged relatively closer to the light incident side and said one conductivity-type layer in a back photoelectric conversion unit arranged adjacent to said front photoelectric conversion unit includes a silicon composite layer at least in a part thereof, and
said silicon composite layer has a thickness of more than 20 nm and less than 130 nm and an oxygen concentration of more than 25 atomic % and less than 60 atomic %, and includes silicon-rich phase parts in an amorphous alloy phase of silicon and oxygen.

2. The stacked-layer type photoelectric conversion device according to claim 1, wherein said silicon-rich phase part includes a silicon crystal phase.

3. The stacked-layer type photoelectric conversion device according to claim 1, wherein said silicon-rich phase part includes doped amorphous silicon.

4. The stacked-layer type photoelectric conversion device according to claim 1, wherein refractive index of said silicon composite layer regarding light of 600 nm wavelength is more than 1.7 and less than 2.5.

5. The stacked-layer type photoelectric conversion device according to claim 1, wherein said substrate is transparent, and a reflection spectrum of light having passed through the substrate and entered said stacked photoelectric conversion units has at least one maximal value and at least one minimal value of reflectance in a wavelength range of 500 nm to 800 nm, and a difference between said maximal value and said minimal value is at least 1%.

6. The stacked-layer type photoelectric conversion device according to claim 1, wherein dark conductivity of said silicon composite layer is more than $10^{-8}$ S/cm and less than $10^{-1}$ S/cm.

7. The stacked-layer type photoelectric conversion device according to claim 1, wherein in said silicon composite layer, an intensity ratio of a TO mode peak derived from crystalline silicon phase parts to a TO mode peak derived from said amorphous alloy phase, measured by Raman scattering, is more than 0.5 and less than 10.

8. The stacked-layer type photoelectric conversion device according to claim 1, wherein an optical energy gap of said silicon composite layer is at least 2.2 eV.

9. The stacked-layer type photoelectric conversion device according to claim 1, wherein in said silicon composite layer, an energy difference between upper most energy of a photoelectron having suffered interband excitation loss of O1s and peak energy of the O1s photoelectron, measured by X-ray photoelectron spectroscopy, is at least 2.2 eV.

10. The stacked-layer type photoelectric conversion device according to claim 1, wherein a dopant atom concentration in said silicon composite layer is in a range from $3 \times 10^{20}$ cm$^{-3}$ to $1.8 \times 10^{21}$ cm$^{-3}$.

11. A method of forming the stacked-layer type photoelectric conversion device of claim 1, wherein said substrate, having said silicon composite layer deposited to a part of its total thickness in a plasma CVD reaction chamber, is temporarily taken out to expose a surface of said silicon composite layer to the ambient air, and then after said substrate is introduced again into a plasma CVD reaction chamber, the remaining part of the total thickness of said silicon composite layer is deposited.

12. The method according to claim 11, wherein said substrate is taken out from said plasma CVD reaction chamber to the ambient air after at least 60% of the total thickness of said silicon composite layer is deposited.

13. A method for forming the stacked-layer type photoelectric conversion device of claim 1, wherein a mixing ratio of doping source gas to silicon source gas for deposition of said silicon composite layer in a plasma CVD reaction chamber is in a range from 0.012 to 0.07.

14. An integrated type photoelectric conversion module, wherein a first electrode layer, a plurality of photoelectric conversion unit layers and a second electrode layer successively stacked on a substrate are separated by a plurality of isolation grooves to form a plurality of photoelectric conversion cells, and the cells are electrically connected in series with each other via a plurality of connection grooves, each of said photoelectric conversion cells has a plurality of stacked photoelectric conversion units each including a one conductivity-type layer, a photoelectric conversion layer of substantially intrinsic semiconductor and an opposite conductivity-type layer in this order from a light-incident side, at least one of said opposite conductivity-type layer in a front photoelectric conversion unit arranged relatively closer to the light-incident side and said one conductivity-type layer in a back photoelectric conversion unit arranged adjacent to the front photoelectric conversion unit includes a silicon composite layer at least in a part thereof, and said silicon composite layer has a thickness of more than 20 nm and less than 130 nm and an oxygen concentration of more than 25 atomic % and less than 60 atomic %, and includes silicon-rich phase parts in an amorphous alloy phase of silicon and oxygen.

15. The integrated type photoelectric conversion module according to claim 14, wherein said first electrode layer is separated into a plurality of regions corresponding to said plurality of photoelectric conversion cells by a plurality of first isolation grooves, said plurality of photoelectric conversion unit layers and said second electrode layer are separated into a plurality of regions corresponding to said plurality of cells by a plurality of second isolation grooves, and a connection groove is provided between said first isolation groove and said second isolation groove to electrically connect said first electrode of one of said cells with said second electrode of its neighboring cell.

* * * * *